STORAGE FETCH PROTECT OVERRIDE CONTROLS

BACKGROUND OF THE INVENTION

This invention relates to the fetch protection of a critical area in the main storage (MS) of a data processing system. The critical area is smaller than, and contained within, the size of a main storage block protectable by a single storage protect key having a fetch protection field.

PRIOR ART

Fetch protection in this specification is used in the manner defined in the key in storage section of the prior IBM System/370 Principles of Operation (Form No. GA22-7000-8) which defines the System/370 architecture as providing one storage protect key for each 2 KB or 4 KB block in MS. Fetch protection for a storage request is defined as preventing any storage access by a CPU fetch request having a non-zero key access field in the CPU's current program status word (PSW) which mismatches the access field in an associated key (i.e. the key presently assigned to the block in main storage to which the request is being made). Key zero is an exception because key zero is reserved for use only by supervisory state programs. Therefore, any key zero request is permitted to access storage regardless of a mismatch of access fields and regardless of the state of the fetch protect bit in the storage key. Thus, for a key mismatch (except for key zero) to a fetch protected storage block: (1) when fetch protection is on, both fetch and store non-zero key requests are prohibited during a key mismatch, and (2) when fetch protection is off, only non-zero key mismatching store requests are prohibited but mismatching fetch requests are allowed. Hence, store protection is provided against mismatching non-zero key requests regardless of the state of the fetch protect bit. Some current System/370 control programs (e.g. MVS/SP) allocate and deallocate MS in units of 4 KB page frames. Under System/370 architecture, each CPU has its PSA page frame assigned to real addresses 0 through 4095 to contain critical hardware control related information. In a multiprocessor (MP), using for example MVS/SP, each CPU has its PSA page frame assigned to a different absolute address in shared MS by applying different prefixes to the real byte addresses 0-4095 for the respective CPUs.

System/370 CPUs have two 2 KB protection blocks for which both 2 KB storage protect keys are set to the same value for MVS for each 4 KB page frame in main storage. For the PSA page frame, the access fields are set to zero and fetch protect bit is set off in both keys for the two 2 KB blocks. Each other page frame has its two 2 KB keys set identically to each other, and they may be different for different page frames.

More recent System/370 CPUs can have 4 KB protection blocks, each with only one associated key. The PSA page frame has its associated key set with fetch protect disabled, preventing fetch protection for all of its 4 KB bytes in order to allow fetching of addresses 0-2047 KB by all users. Unfortunately, this prevents fetch protection for the other part of the 4 KB block at addresses 2048-4095.

Main store protection has been the subject of much consideration in the prior art, such as U.S. Pat. No. 3,576,544 (Cordero et al); 3,825,903 (W. W. Brown); 3,651,475 (Dunbar et al); and 4,093,987 (Gaudette et al), all assigned to the same assignee as the present application. None of these patents disclose the subject matter claimed in the subject specification.

SUMMARY OF INVENTION

Low storage protect in System/370 (disclosed and claimed in U.S. Pat. No. 4,093,987) protects against store requests using any key including zero. On the other hand, the subject invention does not protect against key zero but permits non-zero keys to access a subarea within an area normally protectable by an associated fetch protect bit.

This invention extends main storage protect key operations for System/370 extended architectures that use 4 KB protect keys for all of its 4 KB pages. This invention recognizes that system integrity is enhanced by providing different types of fetch protection within the PSA page which cannot be done with the associated 4 KB key.

To enable different fetch protections within a special 4 KB block, this invention provides fetch protect override controls to partly override the normal operation of the 4 KB storage key for a page located at a predetermined real address in MS. While 4 KB fetch protection is set on for the special page's 4 KB block, the fetch protect override controls disable fetch protection for a portion of the special page's real addresses (e.g. addresses 0-2047).

Override enablement is controlled by a fetch protect override control bit in a control register (e.g. bit 6 of control register 0).

These and other objects, features and advantages of the invention may be more fully understood and appreciated by considering the following detailed description in association with the accompanying drawings.

BRIEF DESCRIPTON OF THE DRAWINGS

FIG. 1 illustrates the general operation of the invention.

FIG. 2 shows a detailed embodiment of the invention.

DESCRIPTION OF THE DETAILED EMBODIMENT

FIG. 1 illustrates how control register CR0 bit 6 controls the override fetch protection for the preferred embodiment.

It is presumed that the storage key for the PSA block has its access field set to key zero (so that it can be stored into only by supervisor state programs).

The override controls in this embodiment apply to a special 4 KB page having a predetermined real address, called the PSA page, in order to obtain different types of fetch protection for different 2 KB parts of the PSA page. These two parts are predetermined to be located at main storage real addresses 0 through 2047 and 2048 through 4095 in a main storage page frame (i.e. PSA block) located by a prefix value assigned to the respective CPU.

The following TABLE summarizes how the CR0 bit 6 affects the storage operation for a CPU using 4 KB keys:

TABLE

| Fetch Prot. Override Cont. (CR0,6) | CPU Storage Operation |
|---|---|
| 0 | No override control (4KB PSA block fetch protected entirely controlled by the setting of |

CMOS UNIPOLAR NONVOLATILE MEMORY CELL

CROSS-REFERENCE TO RELATED APPLICATIONS

The following simultaneously filed applications of common assignee contain related subject matter, and are hereby incorporated by reference:

High-Voltage CMOS Process, Ser. No. 344,588, filed Feb. 1, 1982.

High-Speed Nonvolatile Memory Array, Ser. No. 344,587, filed Feb. 1, 1982.

Plasma Etch Method For TiO$_2$, Ser. No. 344,562, filed Feb. 1, 1982.

Method For Depositing Polysilicon Over TiO$_2$, Ser. No. 344,563, filed Feb. 1, 1982.

NMOS Source/Drain Doping with Both P and As, Ser. No. 344,589, filed Feb. 1, 1982.

BACKGROUND OF THE INVENTION

The present invention relates to a nonvolatile semiconductor memory cell and array.

While the suitability of double-dielectric structures for information storage has been known theoretically, practical embodiments to utilize the advantageous physical properties of such structures have long been difficult to achieve. Among the difficulties have been the disturbance of half-selected cells by the high voltages used, and slow write and write recovery time required by the high voltages. In addition, some devices have required both high voltage and dual polarity, which causes increased difficulties of power supply and isolation. However, a dense nonvolatile RAM cell, having read and write speeds comparable with (if not equal to) those typical of static RAMs, would be extremely useful.

U.S. patent application Ser. No. 174,980, of common assignee, which is hereby incorporated by reference, disclosed a 4-transistor CMOS nonvolatile RAM cell satisfying most of these requirements. This cell required four connections to each cell, but attractive features of this previous cell included high protection, static read, and read enhance of the written state. However, the requirement of four connections to each cell imposed a density penalty, required relatively complex peripheral circuits, and imposed stringent requirements on clock timing.

It is thus an object of the present invention to provide a memory cell having high protection, static read, and read enhance of the written state, with not more than three connections to each cell.

It is a further object of the present invention to provide a memory cell having high nonvolatile information protection, static read operation, and read enhance of the written state, having improved read-and-write times.

It is a further object of the present invention to provide a random access memory array having nonvolatile information storage, static read operation, and read enhance of the written state, while maintaining good speed and density.

It is a further object of the present invention to provide a random access memory array having nonvolatile information storage, unipolar operation, static read operation, and read enhance of the written state, while maintaining good speed and density.

SUMMARY OF THE INVENTION

To achieve the foregoing objects as well as other advantages, the present invention provides a CMOS nonvolatile memory cell, where multiple-dielectric P-channel device is used to provide nonvolatile information storage. An N-channel device is used to limit current (and thus power dissipation) during $-V_{TH}$ programming, and two other transistors are both controlled by a word line, to selectively connect the cell to a bit line and to a column line. Thus, a total of three connections to each cell are required. The bit and column lines of adjacent columns of cells are combined, and good density is achieved in the memory array. The operating voltages are unipolar, and the read operation enhances the written information.

Thus, in contrast to the read enable transistor of U.S. application Ser. No. 174,980, controlled by a separate read enable line, a different read enable transistor, which has conductivity type opposite to that of the nonvolatile transistor and which is controlled indirectly by the column line rather than by a separate read enable line, is used in the present invention. Thus, the very high gate capacitance which was presented to the separate read enable line is eliminated, density is improved, and good speed is maintained. Moreover, the read enhance effect is strengthened.

According to the present invention, there is provided a memory cell, comprising:

a nonvolatile transistor comprising first and second source/drain regions of a first conductivity type;

a read-enable transistor, comprising first and second source/drain regions of a second conductivity type;

said nonvolatile and read-enable transistors each respectively comprising a gate, said respective gates being connected together;

said respective first source/drains of said nonvolatile transistor and of said read-enable transistor also being connected together, and said second source/drain of said read-enable transistor being connected to ground;

means for selectively connecting said second source/drain of said nonvolatile transistor to a bit line; and means for selectively connecting said gate of said nonvolatile transistor to a column line.

BRIEF DESCRIPTION OF THE DRAWINGS

The present invention will be described with reference to the accompanying drawings wherein.

DESCRIPTION OF THE PREFERRED EMBODIMENTS

Figure 1:
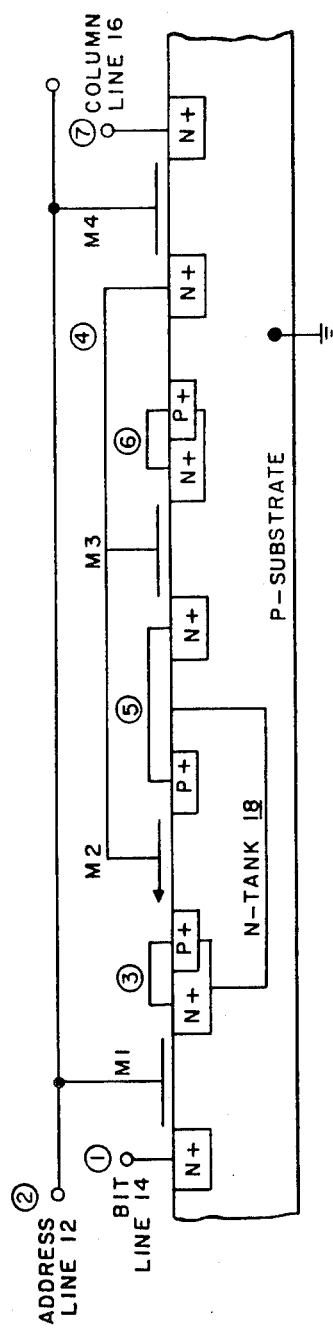
FIG. 1 shows a schematic sectional view of the memory cell of the present invention.

FIG. 1 is a schematic sectional elevation of the memory cell according to the present invention. The four transistors are labeled M1, M2, M3, and M4. M2 is a nonvolatile storage transistor, constructed of MNOS or other multiple-dielectric structure. In addition, the contact areas 1 through 7 are also specifically indicated in this figure. Transistors M1 and M4 are controlled by address line 12, and the cell is thus isolated except when the potential of address line 12 is raised. There is thus no possible disturbance of cells which are half-selected by a bit line 14 or column line 16.

Figure 2:
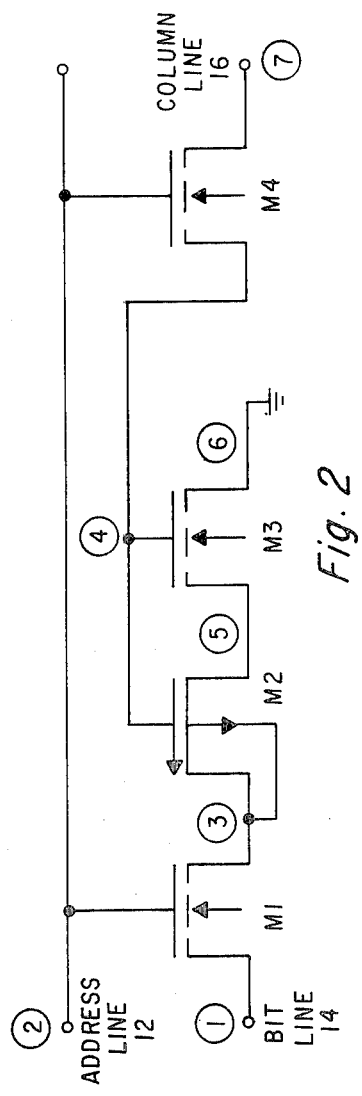
FIG. 2 shows an equivalent circuit diagram of the memory cell of the invention, in one state of programming.

The equivalent circuit diagram of the memory cell is shown in FIG. 2. Note that transistor M2 is shown as a depletion-mode device (although this will vary with its programmed threshold shift), and also that transistors M2 and M3 are of opposite conductivity types. A small N-tank 18 is provided to include P-channel transistor M2. In the memory cell of the present invention isolation transistors M1 and M4 can alternatively be P-channel devices, but the present invention does require that transistors M2 and M3 be of opposite conductivity types, for reasons which will be discussed below. A P-well contains the NMOS devices in the presently preferred embodiment, but is not explicitly shown in FIG. 1 or FIG. 2, since the P-well is the exact complement of N-tank 18.

The operation of this memory cell is as follows: First, if a $+V_{TH}$ is to be written, the address line 12 is raised (to 15 volts) to open isolation transistors M1 and M4. Bit line 14 is set to zero volts, and column line 16 is set to $+15$ volts. Thus $+15$ volts (less the $V_{TH}$ of M4) appears on the gates of M2 (the nonvolatile transistor) and M3 (the read-enable transistor). Since M1 and M3 are both hard on, the source and drain of M2 are both at zero volts. No current flows through transistor M2 (which is off), but a large voltage drop has been created between its gate and channel. Trapped charge is therefore injected into the dielectric structure by tunneling, according to the well known operation of multiple-dielectric devices.

To write $-V_{TH}$, the address line 12 is again taken high, but now the column line 16 is taken low while the bit line 14 is taken high. The gates of M2 and M3 are therefore at zero volts, and the N-tank 18 (the channel region of transistor of M2) is held at $+15$ volts less $V_{TH}$ of M1. Since M3 is held off, no substantial current flows through transistor M2, and the full write voltage appears across the dielectric of M2, so that fast writing occurs. The large inverted voltage which has been created between the channel and gate of transistor of M2 now causes injection of the opposite carrier type, so that the threshold voltage of transistor M2 becomes negative. The effect of the write operation, using the parameters described herein for the preferred embodiment, is to vary the $V_T$ of M2 between approximately $\pm 2$ volts. However, the programmed $V_T$ values are not critical and need not be symmetric opposites.

To read the stored information, the address line 12 is again raised to a high potential, and a relatively small potential of e.g. 8 volts (which must in any case be greater than the N-channel $V_{TH}$) is applied to the column line 16. Thus, transistor M3 is turned on and the source of M2 (at contact 5) is pulled to near ground voltage. The bit line 14 is connected to a load (at about 15 volts) and a sense amplifier, so that the current flow through transistor M2, and thus its programmed threshold state, is sensed. If the $V_T$ of M2 has been programmed to a $+V_{TH}$ state (e.g. $+2$ volts), the huge $K_p$ of M2 means that the tank will be pulled to slightly less than M2's gate voltage when the read voltage is applied. Thus M2 will be turned on, and will pull bit line 14 down. (Typically bit line 14 might be pulled down to about 10 V.) Conversely, if transistor M2 has been programmed to $-2$ volts, M2 will hardly be turned on when the read voltage is applied, and the tank will float up to around 12 volts.

Note that in both $V_{TH}$ states a mild read-enhance occurs, since the voltage drop across M2's dielectric is favorable to the injection of the carrier type which would exaggerate the $+V_{TH}$ state of M2.

The read voltage is selected simply to provide a bit line current which varies with the $+V_{TH}$ state of M2. The optimal read voltage provides both read enhance and a large output signal. A broad range of read voltage values are functional for any one set of device parameters, but the optimal read voltage is 8 volts for the preferred embodiment. For other device parameters than those of the preferred embodiment, other read voltage values can be used.

The read operation also shows another advantage of the present invention over the cell of U.S. application Ser. No. 174,980. In that application, as the tank potential fell while reading a $+V_T$ state, the P-channel read enable transistor would start to turn off, limiting the tank voltage fall and thus reducing the read enhance effect.

Figure 3:
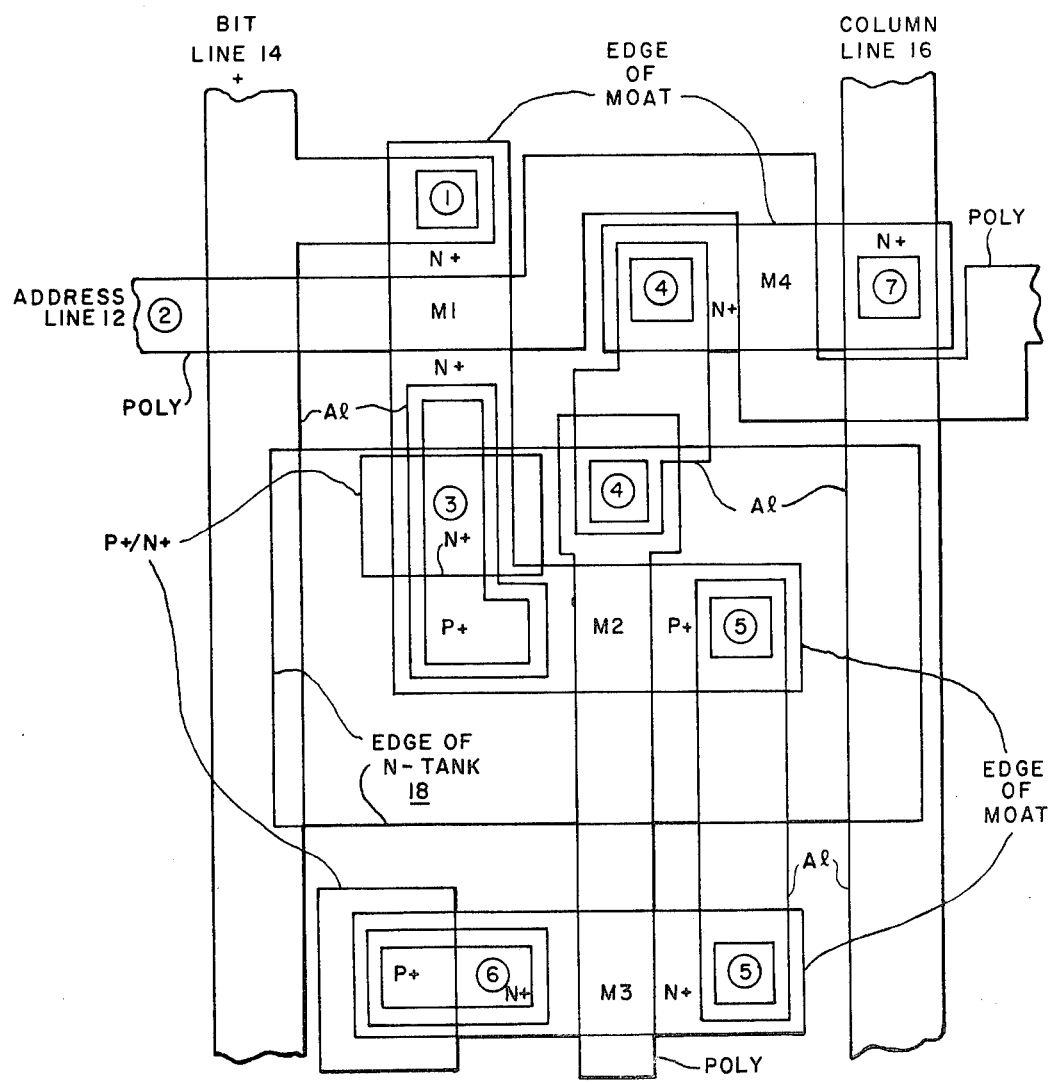
FIG. 3 shows a first mask layout which may be used to make the memory cell of the present invention.

FIG. 3 shows a mask set which can be used to realize one embodiment of the invention. For clarity, the P+/N+ mask adjacent to contact 3 has been shown as shifted, although in fact this mask should have its upper edge registered with the edge of N-tank 18. The contact masks, surrounding contacts 1, 3, 4 (twice), 5 (twice), 6, and 7 have not been labelled, but all other masks are labelled. The metallization areas are labelled as A1, but other equivalents could of course be substituted. The transistors M1, M2, M3, and M4, and contacts 1 through 7 correspond to those so labelled in FIGS. 1 and 2. The cell layout of FIG. 3 is presently realized in 5 micron geometry, and FIG. 3 is drawn to a scale of approximately 2,000 to 1. As will be discussed below, this cell layout may be scaled.

Figure 4:
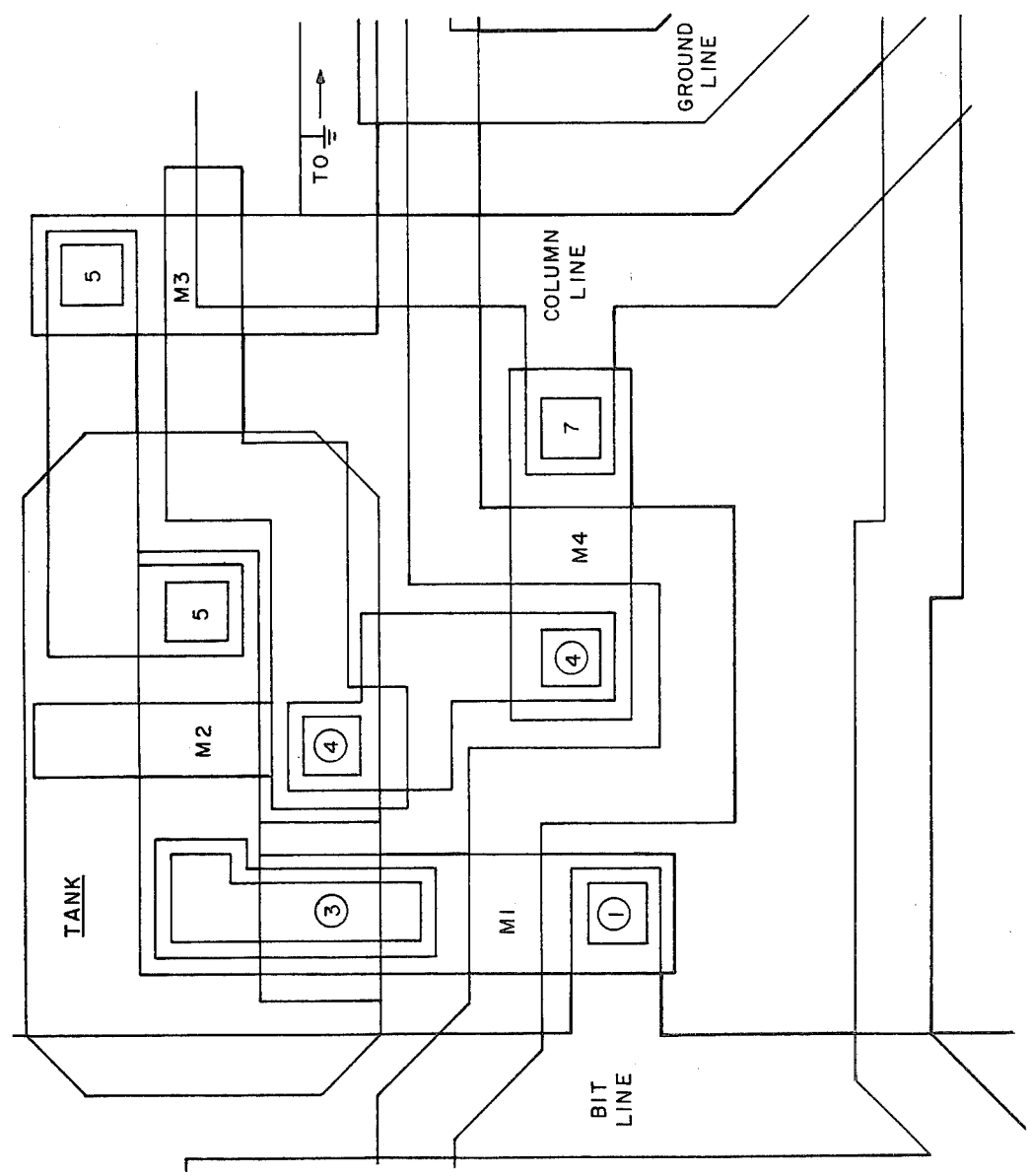
FIGS. 4 and 5 show a second mask set which may be used to make the memory cell of the present invention.
Figure 5:
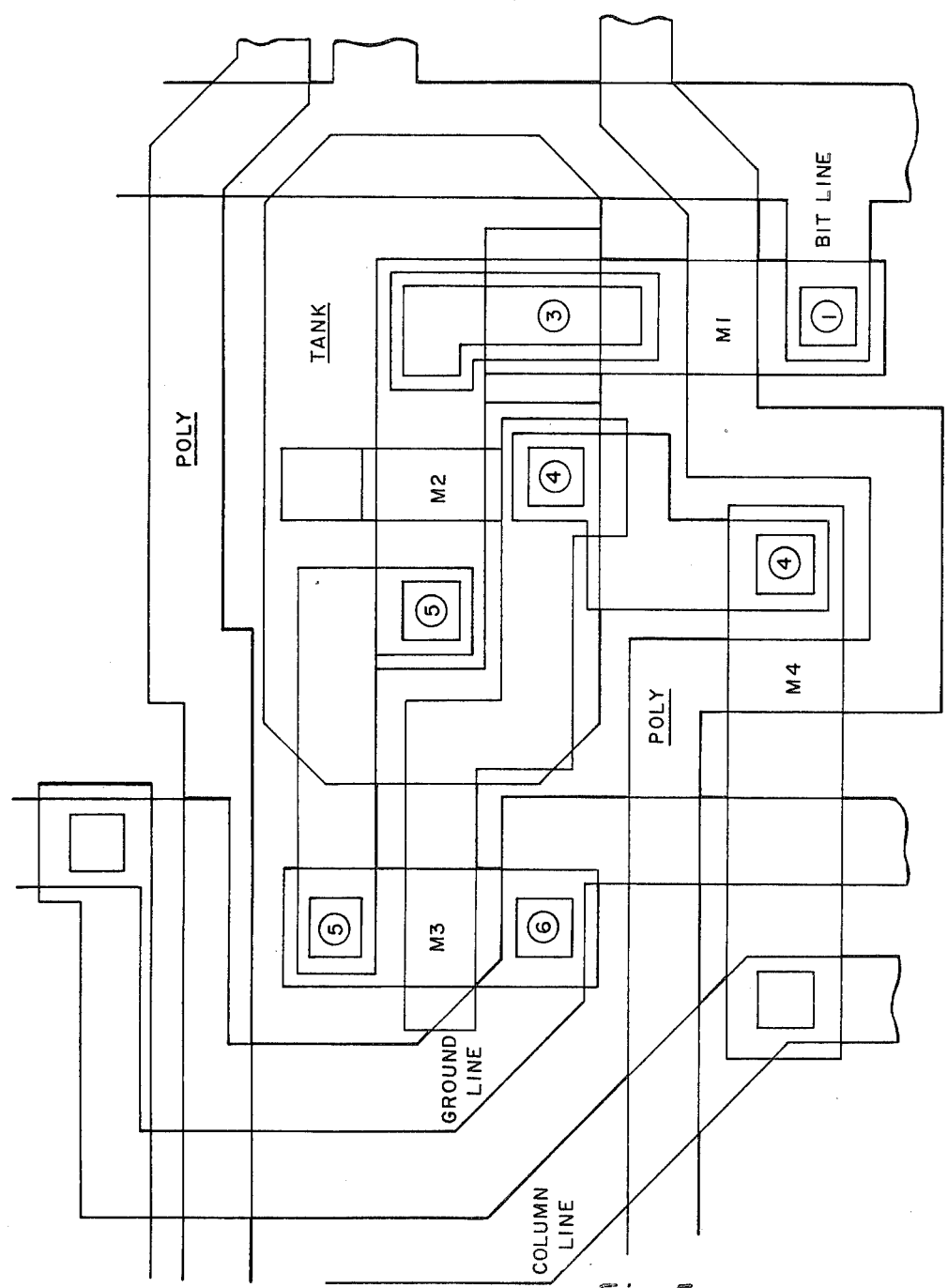
Figure 6:
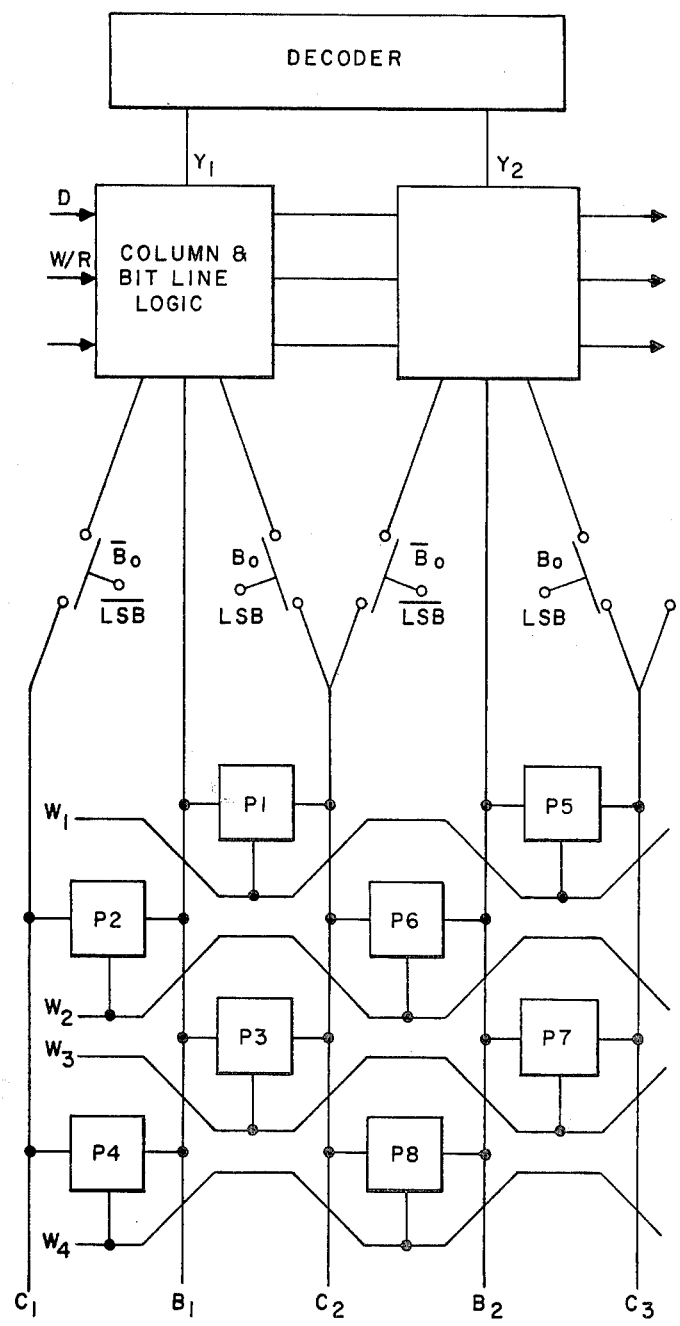
FIG. 6 shows the array organization which would be used with the memory cell embodiment of FIGS. 4 and 5.

FIGS. 4 and 5 show a second mask set which can alternatively be used to realize the memory cell of the present invention. This mask set represents the currently preferred embodiment. This configuration essentially represents a mere repositioning of the configuration shown in FIG. 3, except that a metal ground line 20 is now provided in place of the diffused connection to ground at contact 6 in the cell of FIG. 3. In addition, FIGS. 4 and 5 show two complementary cell layouts, which are integrated into a single array. Note that bit lines and column lines are shared between adjacent columns of memory cells, so that each column line functions as a column line for cells in two adjacent columns. Thus, each polysilicon address line 12 is only connected to one cell in every other column, and sense amplifiers are connected to the bit and column lines in accord with the parity of the row being addressed. Such bit- and column-line sharing is greatly facilitated by the use of only three connections to each cell, and would be far less advantageous with a four-terminal cell. FIG. 6 shows such a memory array schematically.

Figure 7:
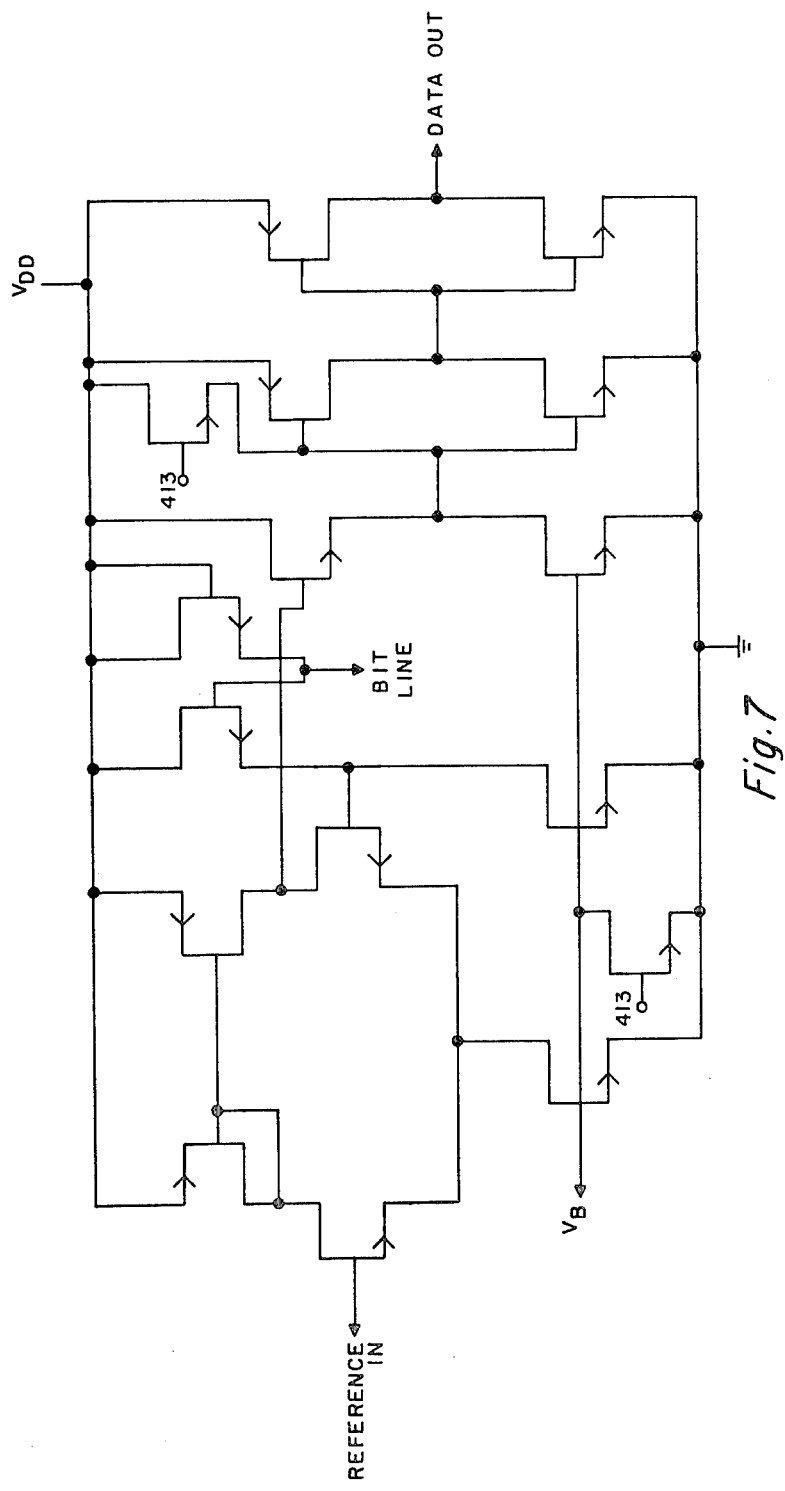
FIG. 7 is a schematic circuit diagram of a comparator which is used to sense the output of the memory cell of the present invention.

The output of a memory cell according to the present invention is essentially analog. To provide optimal sensing of the analog output, a comparator is used to compare the output of a selected memory cell to a reference voltage. The output of the comparator is used to provide a digital data output, and (*only* during periodic refresh, but not during a normal read cycle) also drives a latch, which in turn drives the bit and column lines to enhance the information in the cell just read. A simplified circuit diagram of the comparator is shown in FIG. 7. As is conventional in the CMOS design art, N-channel MOSFETs are shown with an arrow on the source pointing away from the channel region, and P-channel MOSFETs are shown with an arrow on the source side pointing toward the channel region. In neither case is the gate/channel separation explicitly shown. Note that the comparator shown includes multiple amplifying output stages, so that the data out signal is clamped to $V_{DD}$ or ground, i.e. a digital output signal is provided.

Figure 8:
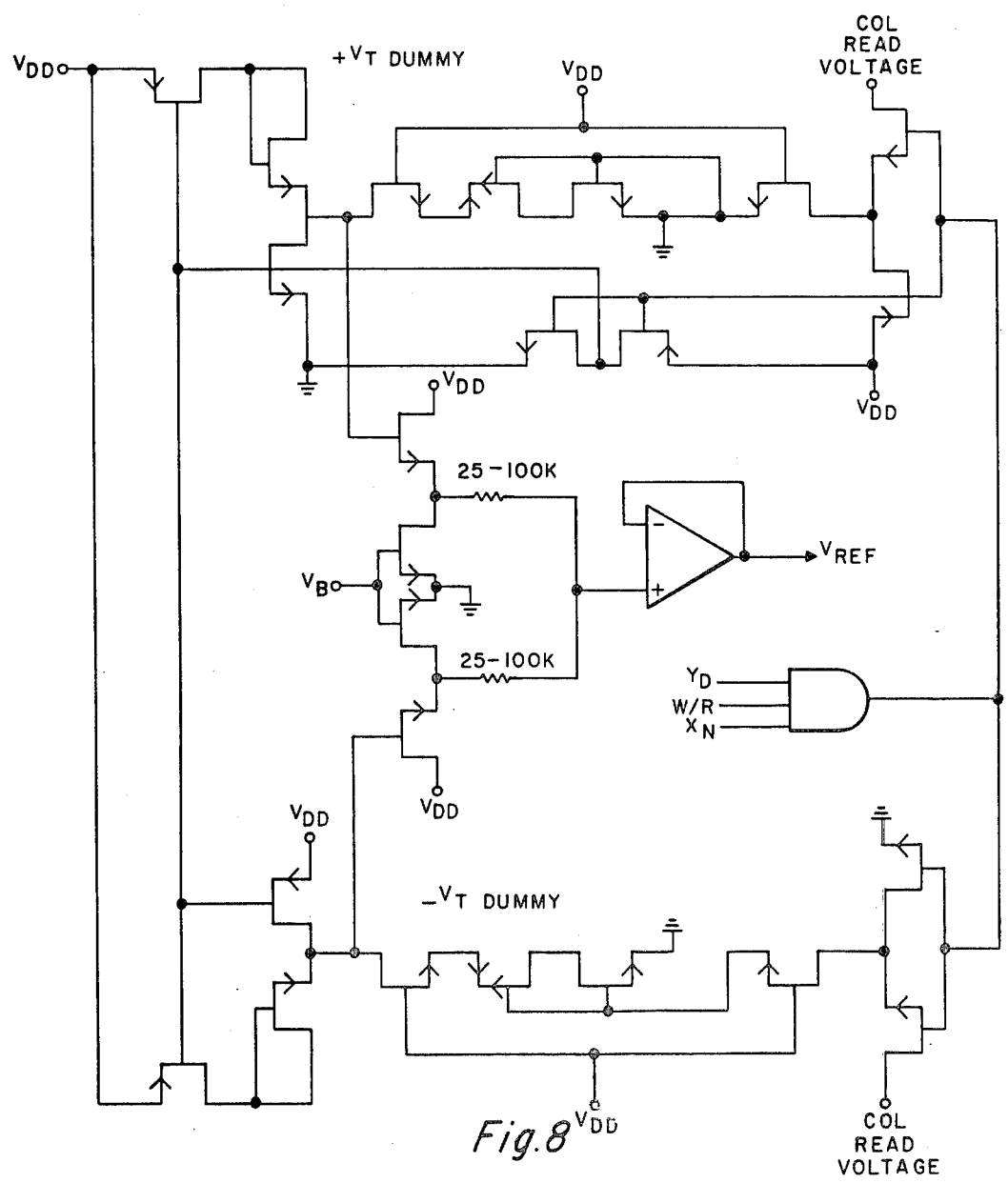
FIG. 8 is a schematic circuit diagram of the reference voltage generator which would be used to provide a reference level to the comparator of FIG. 7 in sensing the memory cell output.
Figure 12A:
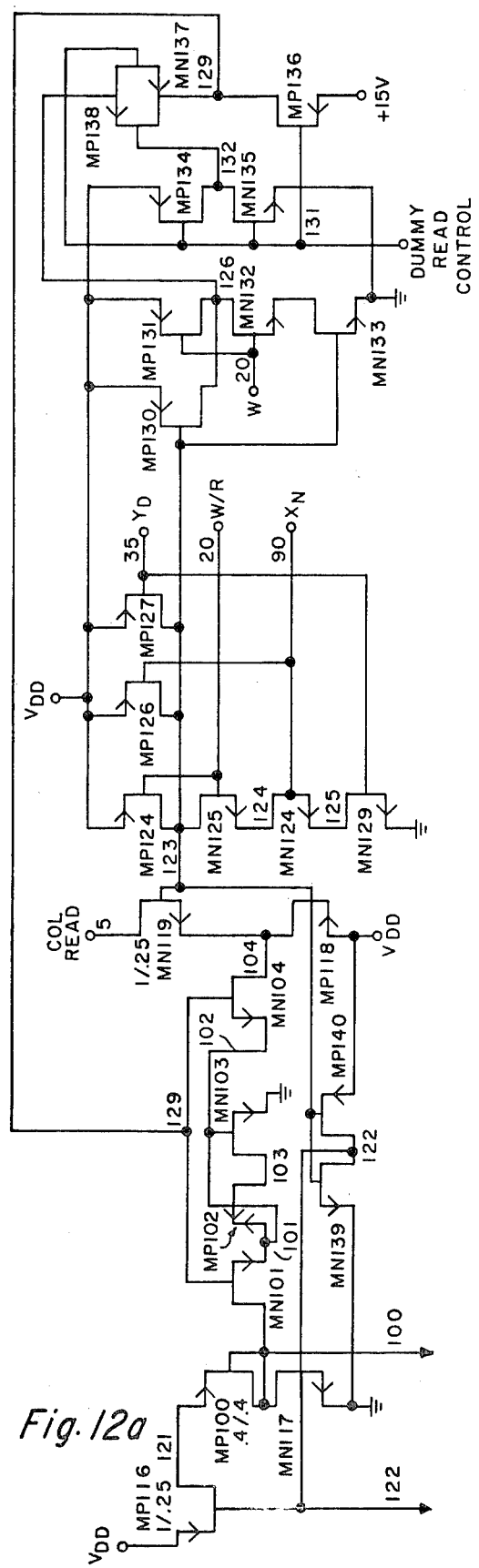
FIGS. 12(a and b) is a more detailed circuit diagram of the presently preferred embodiment of a reference level generator used for sensing the memory cell output.
Figure 12B:
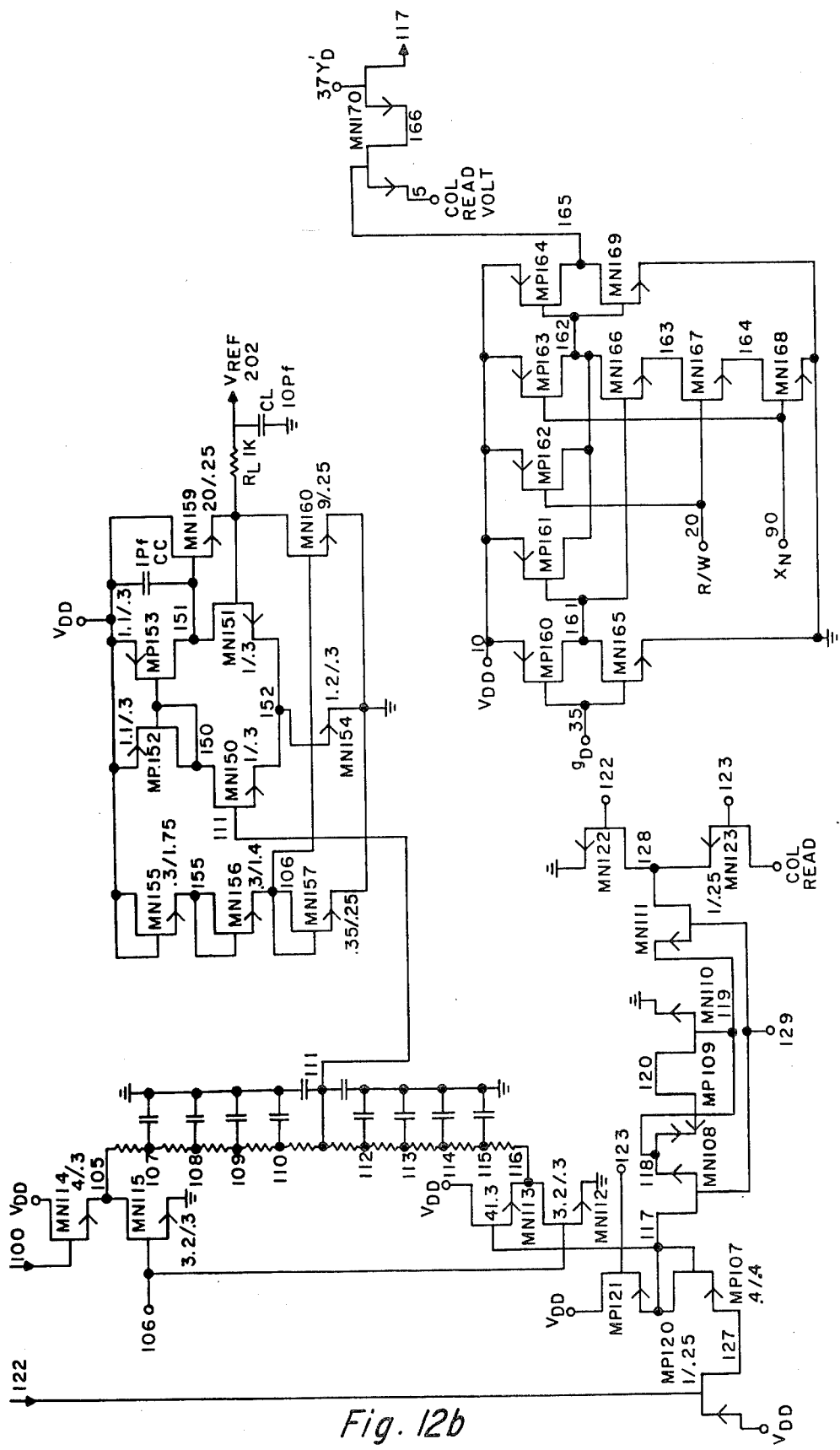
Figure 13A:
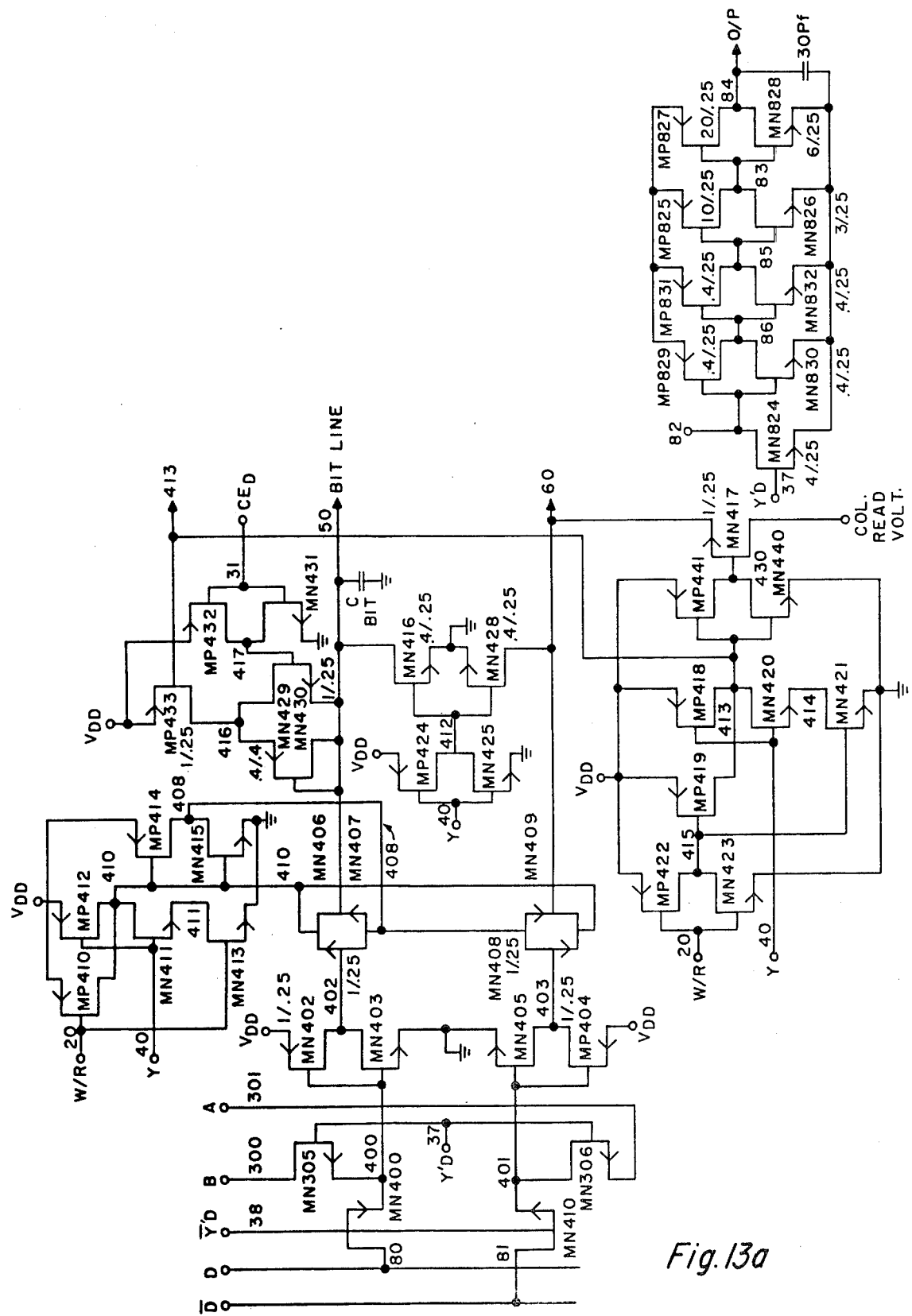
FIGS. 13(a and b) is a more detailed circuit diagram of the column logic.
Figure 13B:
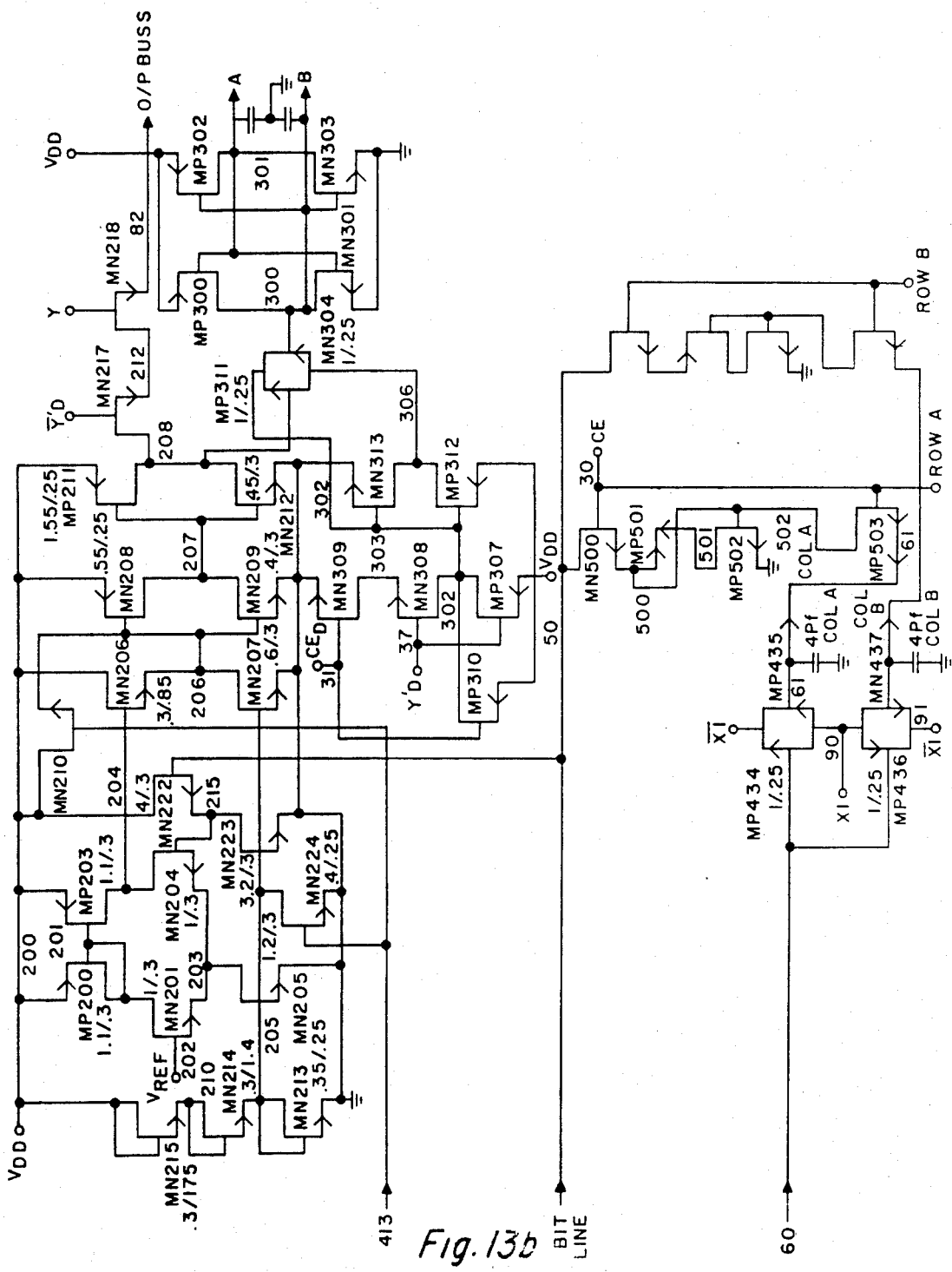
Figure 14:
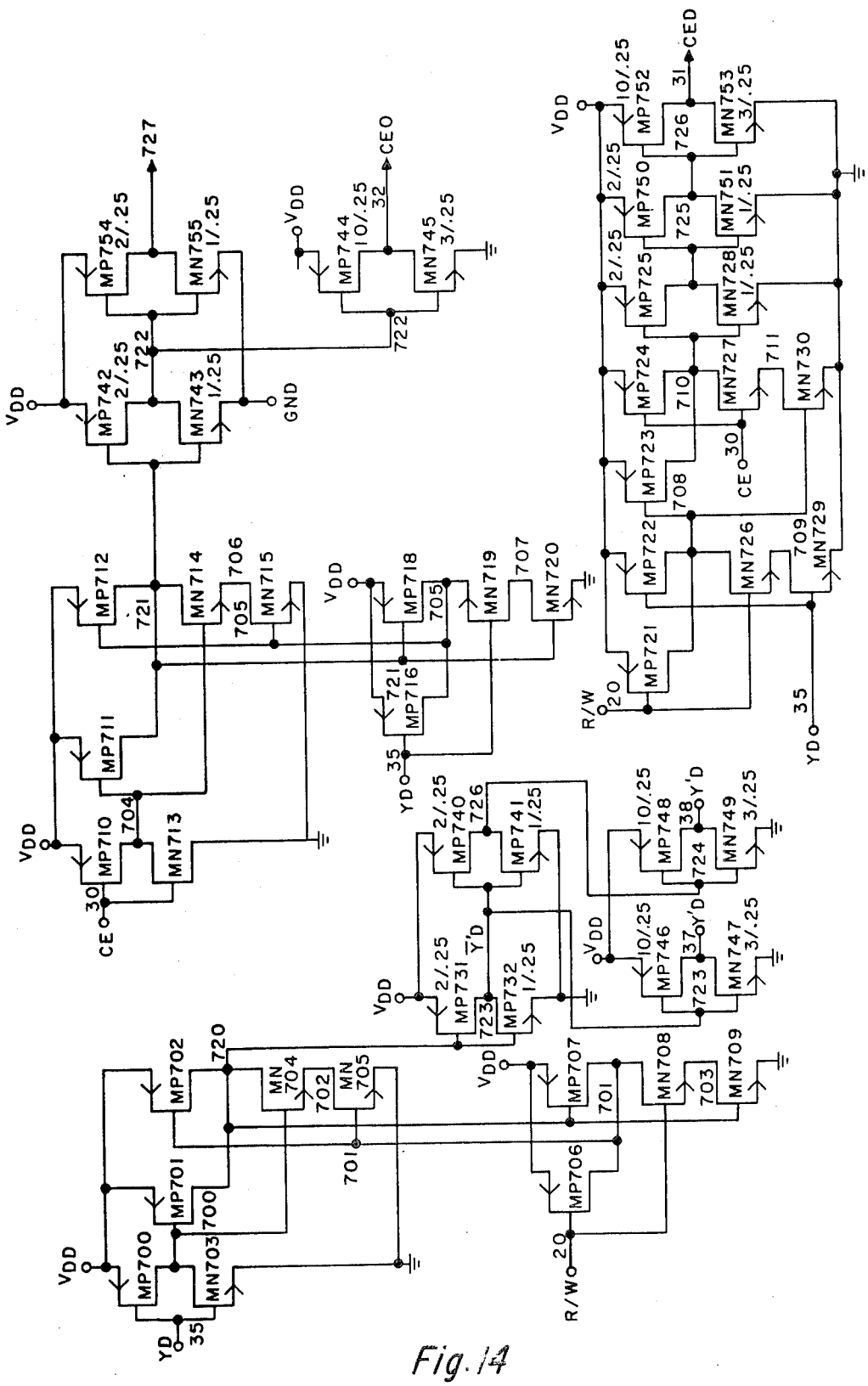
FIG. 14 is a diagram of the chip control logic used to control an array of memory cells of the present invention.
Figure 15:
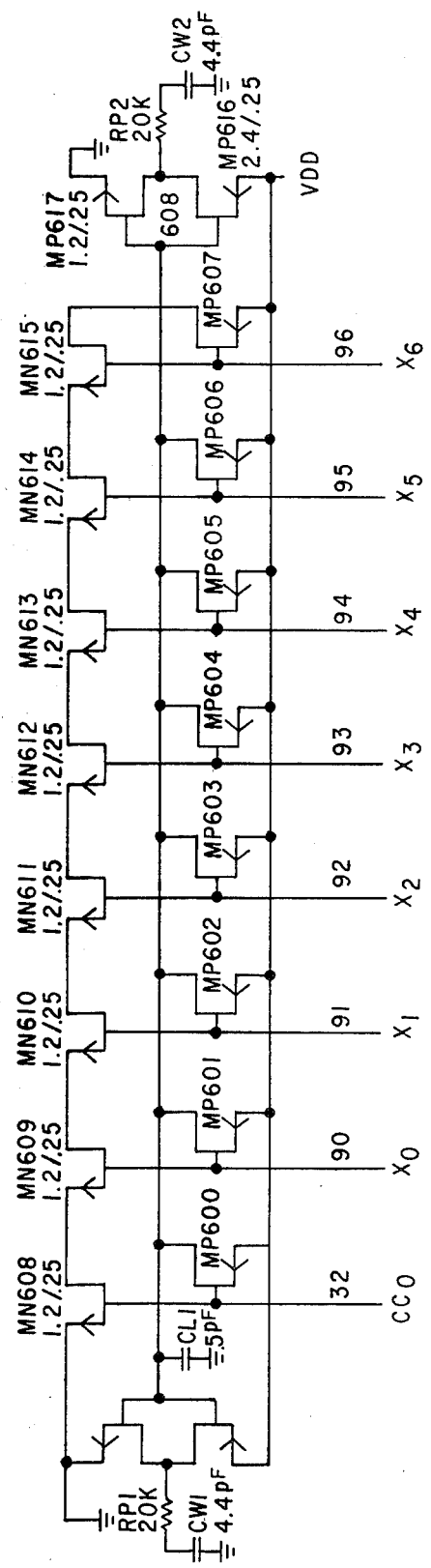
FIG. 15 is a circuit diagram of the X-decoder used in an array of memory cells according to the present invention.
Figure 16:
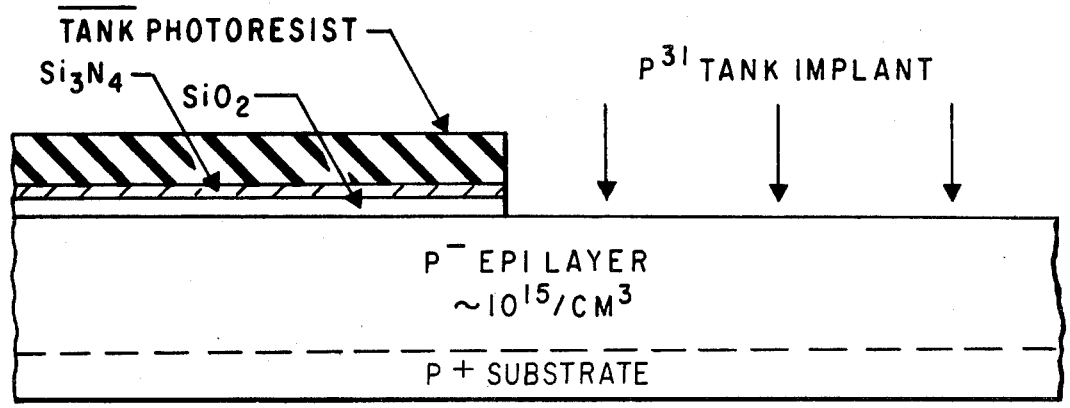
FIGS. 16 through 23 illustrate the sequence of steps in a high voltage CMOS process preferably used to make the memory cell of the present invention.

The reference voltage provided to the comparator is generated by a reference voltage generator such as shown generally in FIG. 8 and in greater detail in FIG. 12. Two memory cells according to the present invention are provided. These cells are always maintained in opposite states, so that the average of their output signals always provides an optimal reference voltage. Note that, in place of the connection of address line 12 to each memory cell in the array, power supply voltage $V_{DD}$ is provided to the two isolation transistors within each memory cell of the reference voltage generator. The NAND gate provides a high voltage to the read/rewrite select circuits selectively. Thus, when a reference voltage is required, the column read voltage (which is about 8 volts) is provided to the gates of the NV transistor and the read enable transistors in each memory cell, and both states of memory cell outputs are provided to the voltage-averaging circuit. Implanted resistors and load elements are used to provide an even average of the output voltages. (The tank implant is used to form implanted resistor areas, of about 1-2 k$\Omega$/□.) A further op amp stage connected in a unity gain configuration is used to buffer the reference voltage output.

For NVRAMs using tunnelling to store charge in dielectric traps, there is a trade-off between write speed and storage time, because the same potential barriers which retard leakage of trapped charge into the channel also impede fast writing. (Avalanche-assisted write mechanisms partly avoid this dilemma, but only at the expense of greatly reduced device lifetime. The lifetime of an avalanche-write cell will typically be on the order of $10^5$ cycles, as opposed to $10^{14}$ cycles for the cell of the present invention.) Thus if a nonvolatile memory is to attain write speeds remotely comparable to those of a DRAM, relatively short nonvolatile storage times must be tolerated. For example, a memory having a 200 nsec write time will have a nonvolatile storage time down around 3 days.

For short retention NVRAMS, e.g. those having a storage time of less than thirty days, periodic refresh is necessary. A suitable refresh time would be, e.g., of the approximate order of 1 second. If refresh time is too short, the excessive number of rewrites would threaten to exercise the array so often that cell lifetime would needlessly be wasted. Conversely, a very long refresh time would require inconveniently long counting sequences. For maximum speed of the refresh cycle (and therefore maximum availability of the memory chip) the periodic refresh is done row by row, rather than bit by bit. Bit by bit refresh would be exceedingly slow, especially for a large memory, but external refresh circuitry is only adequate for bit by bit refresh. The circuitry needed to achieve control of periodic refresh is of the order of 20 additional transistors per column. An extra control line (the rewrite line $Y_D$) is also required for periodic refrsh. Note that the column circuitry can be laid out by step and repeat, since only one design is used.

Figure 10:
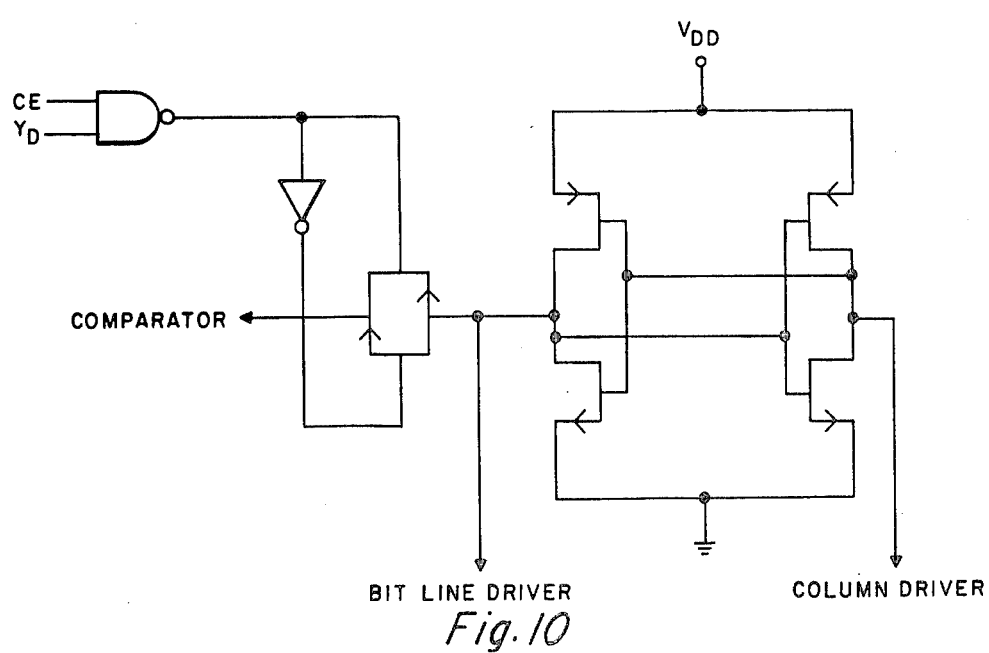
FIG. 10 is a schematic view of the latch used to permit rewriting of information in a memory cell to be refreshed.

A circuit diagram of the latch used to provide rewrite of a memory cell to be refreshed is shown in FIG. 10. The data output of the comparator drives a conventional CMOS cross-coupled latch, if the latch is enabled by the CE and $y_D$ lines, to drive the bit and column lines appropriately to rewrite the read information.

Figure 9:
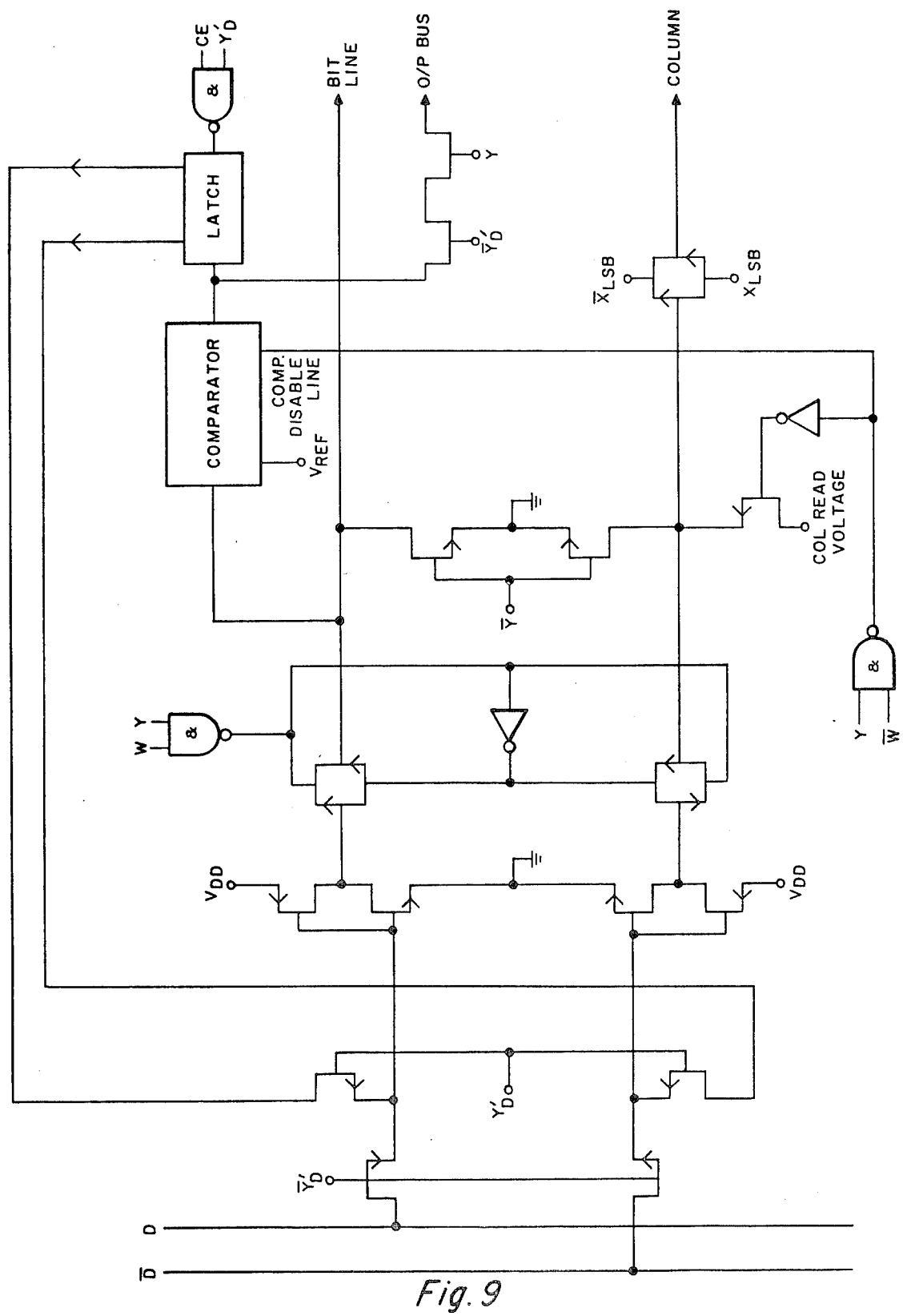
FIG. 9 is a schematic view of the column logic and rewrite circuitry.
Figure 11:
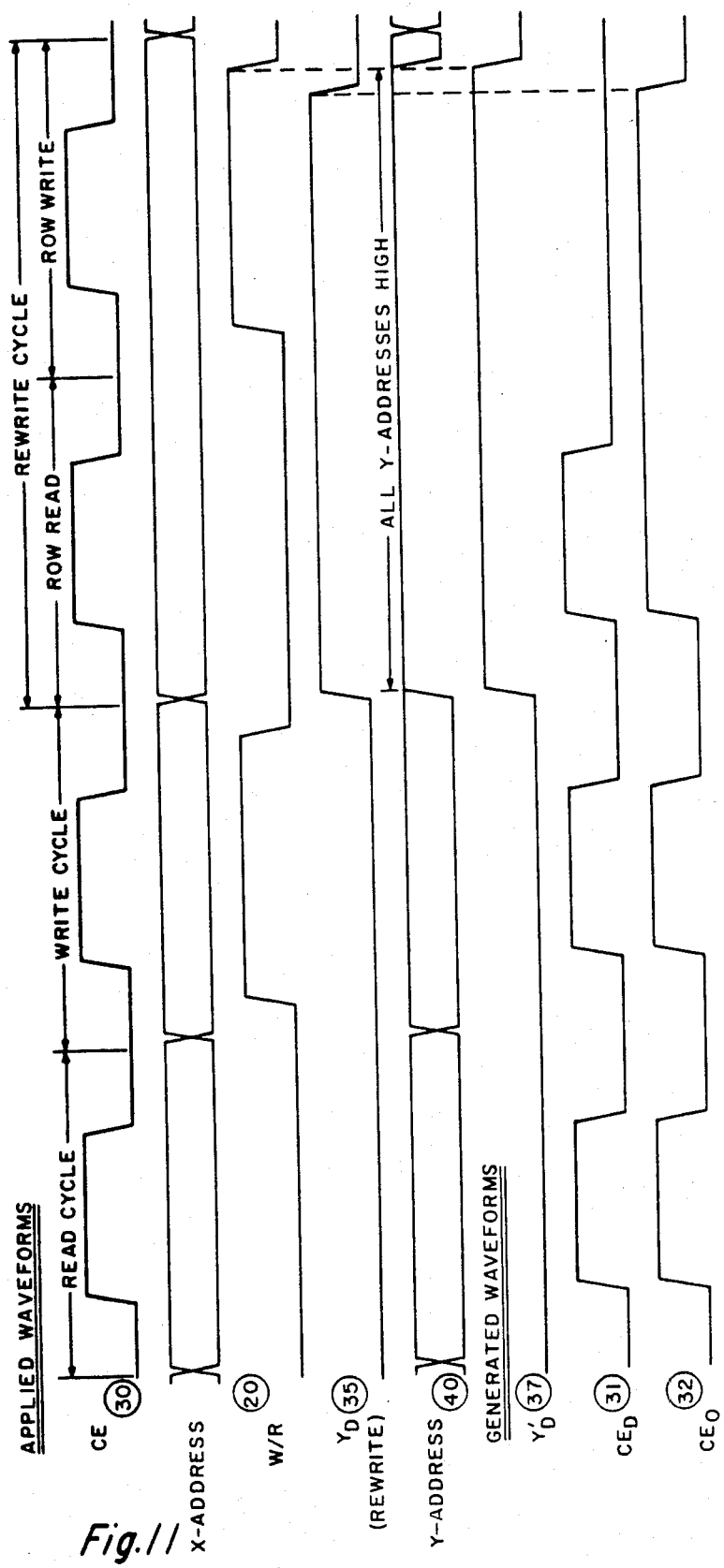
FIG. 11 is a timing diagram showing the operation of an array of memory cells according to the present invention.

FIG. 9 provides an overview of the column logic and rewrite circuitry. Note that the comparator of FIG. 11 and the latch of FIG. 12 are shown as blocks.

The timing of the signals generated by the circuits discussed above is shown in FIG. 11.

The X decoder circuitry is a conventional CMOS NAND gate implementation of the seven bit to 128 line decoder. The decoder is also connected to the CE line, which effectively defeats the decoder, holding all lines low. This allows the potential on the appropriate column to be set up before the individual cell is accessed. The Y circuitry is a NAND gate five bit to 32 line decoder. This decoder has the rewrite pulse line added so that the decoder can be defeated. In this case all the Y outputs go high so that every bit on each row can be simultaneously read or written.

Read Cycle

The X and Y addresses are selected with the read/write line at read, $Y_D$ remains OFF.

Under these conditions the Y selected column logic is in the read mode with the column read applied to the column through MN417 and the bit line pre-charging through MP433 and MN430. The sense amp is activated since MN224 is held off with node 413 being low. As $Y_D$, and therefore $Y_D'$, is low the latch is isolated from the sense amp and the O/P of the sense amp is connected to the O/P bus via MN217 and MN218. The "write" section of the column logic is deactivated since nodes 410 and 408 and high and low respectively.

The reference generator is producing $V_{REF}$ in this mode since each dummy cell is being read. MN119 is "on" since mode 123 is high, as is node 129. MP116 and MP120 are "on" threby providing $V_{DD}$ for dummy cells.

CE now goes high. This enables the X-address and accesses the cell to be read. MN430 is now turned off so the load appears on the bit lines. (Note: For the X-decoder $CE_O$ is generated and, for the Y, $CE_D$. In the read mode CE going high does not alter any other condition. The cell is now read.

CE now goes low, $CE_D$ and $CE_O$ follow CE. The accessed cell is now isolated. A new cell can be read or written.

Write Cycle

The X and Y addresses are selected with the read line low and CE low, $Y_D$ remains low.

The write line now goes high. This disconnects the column read voltage from the column and turns MP433 "off"; it also disables all the sense amplifiers. The write circuitry of the selected Y column logic is also activated since nodes 410 and 408 are low and high respectively. This connects the data lines directly to the bit and column lines of the selected Y. (Note: Since $Y_D'$ is low devices MN400 and MN401 are "on", devices MN305 and MN306 are off.)

CE, and hence $CE_D$ and $CE_O$, go high. This enables the X-address and accesses the cell to be written. The latch remains isolated and although node 417 now goes low, the bit line can be taken to +15 V or 0 V since MP433 remains off during writing.

Note: When writing a selected column the O/P buss will always go high. This occurs because both MN217 and MN218 are "on". The O/P of the sense amp will be high because it is disabled by MN224 being "on". (This does not occur during rewrite since MN217 will be off.)

Depending upon the potential applied to the dummy read control, node 131, the dummy will remain generating $V_{REF}$ or it will be turned off during a normal write cycle. With node 131 low node 129 is taken high and the dummy continues to generate $V_{REF}$. If node 131 is high, node 129 is taken low and the dummy is turned off.

Refresh Cycle

For rewriting an extra pulse is used, called the rewrite or Y override pulse, $Y_D$. Application of this pulse defeats the Y decoder and sets all the column addresses high.

The read/rewrite cycle is as follows:
Read/write line is set to read.
The X address is set, Y address is don't care.
$Y_D$ is set high so all the Y addresses are set high. $Y_D'$ follows $Y_D$ and therefore disables the data lines into each cell. The bit line is currently being preset and the column line is at the read potential. The output of each sense amp is disconnected from the O/P bus since MN217 is off. The latch remains isolated from the sense amp but is connected to the write line buffers, nodes 400 and 401.

CE now goes high and with it $CE_D$ and $CE_O$. This accesses the X address to a single row of cells. $CE_D$ going high accesses the latch at the O/P of each sense amp, i.e. each cell in the addressed X row is being read into the latch. The dummy continues to be read and generates $V_{REF}$.

CE now goes low and with it $CE_D$, $CE_O$ remains high. $CE_D$ going low isolates the latches from the comparators, i.e. the read data is locked into the latches. (Note: MN430 is turned "on" by $CE_D$ going "off" and cell reading finishes. Therefore the read data must be locked into the latch before the "false data" is passed through the sense amp, i.e. the bit line being taken high by $CE_D$ going off. Considering the number of delay stages this should be OK.)

As was mentioned, CE going low does not turn the X address off, it remains high, held on by $Y_D$.

Set read/write to write. This writes the latched data back into the row of cells addressed by the X-decoder. If the X line used by the dummay rewrite enable is high, node 90, the dummy is also rewritten at this time.

CE goes high once more. However, becasue $Y_D$ and R/W are currently high CE tc the column logic is defeated, i.e. $CE_D$ remains low. This allows the data that is currently being rewritten to remain isolated in the latch and to be unaffected by the comparator being reset. (The comparator was reset (MN224 turned "on") when the R/W line went high.) (If $CE_D$ did not remain low the gate between the comparator and latch, MN304, MP311, would turn on.)

CE goes low once more. $CE_O$ remains high, held on by $Y_D$. The cells therefore continue to be rewritten.

$Y_D$ now goes low. This isolates every cell in the memory, i.e. no row is addressed. This also stops the dummy being rewritten. Note: $Y_D$ going low does not turn off the feedback switches, MN305 and MN306, from the latch to the bit and column lines, they stay "on", held "on" by $Y_D'$ which is kept high by R/W being high.

Write goes low to read value. The feedback switches are turned off and the regular switches from the data bases turned "on".

Regular read or write cycle.
Dummy cell cycles:
With the W/R low node 123 is high, therefore node 104 is at the column read voltage and MP118 is off. Node 122 is low, therefoe MN117 is off and MP116 is on. $V_{DD}$ is therefore applied to the load. With the dummy read control at "0" 15 V is applied to node 129 through MP136, with it at a "1" node 126 is joined to 129, therefore MN101, 104, 108 and 111 are "on" and the two dummy cells are read. An average read signal appears at node 111 which is buffered by the unity gain amp at node 154.

If the dummy read control is at a "0" the dummy cells remain in the read mode since mode 123 is at "1", 122 is at "0" and 129 is at "1". If the DRC is at a "1" node 126 is at a "0" and therefore so is node 129. This means that the dummy is not read and $V_{REF}$ is not generated. This mode of operation has been included to ascertain whether deterioration in the reference circuitry occurs if the nonvolatile transistors are read continuously during read and write.

The dummy is rewritten when $Y_D$, W/R and $X_N$ are all high. ($X_N$ is a single decoded X address.) At this time node 123 is low therefore node 129 is high independent of the DRC line potential. Since 123 is low node 104 is high and node 122 is high, therefore node 100 is low and MP116 is off.

This dummy cell is therefore written with a $+V_T$ since the NV gate is taken high and the tank low.

The other dummy cell has its column line taken to GND since MN122 is "on" and MN123 is "off". MP120 is "off" and MP121 is "on", therefore the bit line is taken high. In this case the dummy is written with a $-V_T$, i.e. the NV gate is low and the tank high.

On the dummy cell that is written with a $-V_T$ node 117 is taken to $V_{DD}$. Since the NV device in this cell has been programmed hard "off", node 117 tends to float at 15 V and the correct reference voltage is not produced on the next read cycle. To prevent node 117 from floating at 15 V extra circuitry is included in this dummy so that, with $Y_D$ and R/W low, $X_N$ high, and $Y_D'$ high, node 117 is discharged to the column read voltage. As soon as $Y_D'$ goes off (it goes off with W/R) node 117 can charge up through the load MP107 to produce the correct $-V_T$ O/P voltage.

Note: Node 117 only gets returned to the column read voltage at the end of a rewrite cycle and then only if $X_N$ is high, i.e. $X_N$, R/W and $Y_D'$ all have to be high.

During a rewrite cycle when $X_N$ has not been selected the dummy cells continue to be read, if PRC is high $V_{REF}$ will not be produced.

The process by which the memory cell (or array) of the present invention is formed will now be discussed in greater detail. The two problems which this process must solve are: First, high voltage CMOS process is required. Since voltages of 15 volts will normally be used in the circuitry for the preferred embodiment of the memory cell of the present invention, a process which will reliably produce breakdown voltages and field thresholds of approximately 20 volts or better is required. Second, formation and patterning of the nonvolatile (multi-dielectric) stack must be included within a CMOS fabrication process. The process innovations required tto accomplish these two objectives are essentially separate.

The key difficulty in a high voltage CMOS process is to keep both NMOS and PMOS source/drain breakdown voltages, and field threshold voltages as well, above 20 volts (for a circuit which operates a 15 volts), while keeping the mask count down. A further difficulty is high resistance in polysilicon wiring which has been exposed to heavy tank implants. While 15 volts is the operating voltage in the presently preferred embodiment, lower write voltages (down to 10 volts) are used when lower write speed is acceptable. A thinner dielectric stack is used for the lowest write voltages, at the expense of lowered storage time.

The preferred embodiment of the present invention uses a multiple-dielectric nonvolatile storage transistor incorporating a layer of $TiO_2$. Use of $TiO_2$ is desirable since its very high dielectric constant means that nearly all of the applied voltage appears across the $SiO_2$ layer, while the high resistivity of the $TiO_2$ still provides good resistance to catastrophic breakdown. Thus, the pinhole defects which are likely to appear in very thin oxide layes are less likely to be fatal, so that yield is improved, but the fast write characteristics of a very thin oxide are obtained nevertheless. Further details regarding the use and advantages of $TiO_2$ dielectrics in a nonvolatile stack are provided in U.S. patent application Ser. No. 968,544 and U.S. Pat. Nos. 4,200,474 and 4,250,206, which are all hereby incorporated by reference.

A major difficulty in using $TiO_2$ dielectrics is that the technology of etching $TiO_2$ has been relatively primitive. $TiO_2$ is so inert that no wet etching process has yet been found to give any etch rate large enough to be useful. Moreover, selective etching processes, which will etch $TiO_2$ but not polysilicon or $SiO_2$, have only now been developed. Therefore, one alternative way to make the present invention does not use any $TiO_2$ etching step at all, but instead selectively etches titanium. The preferred embodiment of the invention uses plasma etching technology as described below.

A second difficulty which has previously obstructed use of $TiO_2$ is the formation of polysilicon over $TiO_2$. For previously unknown reasons, attempts to form polysilicon gates atop $TiO_2$ dielectrics have formerly yielded very low quality polysilicon known as "hazy poly". This problem too has now been solved, by the hydrogen annealling step discussed below.

A third potential problem is unwanted diffusion of titanium into silicon. Since titanium in silicon is electroactive and mobile, it is an undesirable impurity. In any moderately high temperature step, such as the oxidation of the titanium to form $TiO_2$, titanium may tend to migrate substitutionally into an $SiO_2$ layer, and even to diffuse through it. Silicon nitride may be used as a diffusion barrier, but the 15 nm layer of silicon nitride in the nonvolatile stack discussed above is not thick enough to provide a complete diffusion barrier. The same problem of diffusing titanium is found where a layer of $TiO_2$ exists adjacent to elemental silicon.

A fourth problem is lateral leakage between polysilicon gates over $TiO_2$. When polysilicon is deposited over $TiO_2$, a region of anomalously high conductivity occurs at the surface of the $TiO_2$. If a continuous span of $TiO_2$ exists between gates, gate-to-gate shorting may be caused.

The innovations by which the present invention solves these problems will now be discussed in detail. The high voltage CMOS process will first be discussed, and then the modifications of the generally applicable high voltage CMOS process used to permit formation of a nonvolatile stack will be introduced.

The present invention preferably uses a P—on—P+ structure, with both a P-well and an N-tank being implanted within the Pepitaxial layer. The process as presently practiced is optimized for 15 volt operation with 5 micron gate lengths, but scaling to, e.g., 10 volt operation with 3 micron gate lengths is straightforward.

The process permits a 10 mask process using negative resist (since two masking steps are used to form the contact level) or a 9 mask process using positive resist. The starting material is a P+ substrate, doped to about $10^{18}$ per $cm^3$, with a 16 micron thick P-type epitaxial layer thereon, doped to about $10^{15}$ per $cm^3$. Evaluation of latchup performance using the process of the present invention indicates that 16 micron epi gives adequate latchup protection for 15 volt operation of internal circuits. For I/O circuits, further protection can be achieved by the addition of guard rings which are implanted with the N+ source/drain implant. Although this requires the use of metal jumpers in the I/O circuits to permit a poly line to cross between P and N channel devices, the area penalty is very small as a percentage of chip size. By providing guard ring structures only in the I/O circuits, which are more likely to receive externally generated high-voltage transients, good resistance to high-voltage transients is provided without significantly increased process complexity or area inefficiency.

Two layers of poly are used, with a regrown gate oxide. The first polysilicon level can be doped by ion implantation, and is therefore suitable for capacitor bottom plates and for natural $V_T$ transistors. In addition, resistors are optimally formed in this first poly level.

The first poly level is also useful in forming a nonvolatile transistor, as will be discussed below. The second level of polysilicon is used for regular gates and interconnects. This level is preferably silicided by the co-evaporation of titanium and silicon, so that the sheet resistance of the second poly layer is effectively reduced to around 5 ohms per square. This avoids the difficult compromise between resistivity and etching characteristics which is otherwise necessary. When polysilicon is POCl$_3$ doped to below about 50 ohms per square, plasma etching tends to proceed selectively along grain boundaries, in effect removing the polysilicon in chunks. Polysilicon having 50 ohms per square sheet resistance is bad enough for circuit design, but portions of the poly will be exposed to the P-type source/drain implant, and therefore have an even higher sheet resistance. Siliciding the second poly avoids the sheet resistance problem, and siliciding by means of co-deposition of titanium and silicon adds almost no additional process complexity.

The final P-channel (N-tank) surface concentration is around $10^{16}$ per cm$^3$, and the tank depth is about 4 microns. The gate oxide thickness of 70 nm, the resulting body effect is about 1.4 V$^{\frac{1}{2}}$, and the Kp is 5 microamps per volt$^2$. For the majority of circuit designs, the high P-channel body effect is not an issue, since the N-tank can always be returned to the source.

The final N-channel (P-well) surface concentration is around $2\times10^{15}$ per cm$^3$, with a resulting body effect of 0.4 V$^{\frac{1}{2}}$ and a Kp of 16 microamp per volt$^2$.

A blanket boron implant is used to simultaneously set the V$_{TN}$ (the NMOS threshold voltage) and V$_{TP}$ to plus and minus 1.5 volt. A blanket implant can be used to symmetrize the PMOS and NMOS threshold voltages at only one voltage level, and plus and minus 1.5 volts happen to be paired values conveniently available with the process parameters specified.

The PMOS and NMOS field thresholds are both around 22 volts or greater. This is achieved with a 1.1 micron field oxide, and a blanket boron field threshold adjust implant. The initial field threshold in PMOS regions is higher than required, and the threshold adjust implant dose is selected to equalize the field threshold in PMOS and in NMOS regions. With doping levels as described above, the field threshold levels are equalized at around 22 through 25 volts. Thus, no masking step is required for field threshold adjustment.

The PMOS and NMOS source/drains are implanted with boron and with phosphorus respectively, yielding junction depths around 0.75 micron with junction breakdown voltages around 23 volts.

The baseline process flow for the high voltage CMOS process is illustrated in FIGS. 16-23. Starting material is a P+ substrate, doped to about $10^{18}$ per cm$^3$, with 16 micron epitaxial P-type layer, doped to around $10^{15}$ per cm$^3$. The thickness of the epitaxial layer is controlled by two factors: First, the thicker the layer, the less effective it will be in suppressing latchup; second, the thinner the layer, the greater the leakage current and capacitative coupling into the substrate may be. The epitaxial layer doping is selected as discussed in U.S. patent application Ser. No. 327,661, filed Dec. 4, 1981, now abandoned which is hereby incorporated by reference.

A 50 nm initial oxide is grown, and 140 nm of silicon nitride is deposited. These layers are etched using the tank-complement image, and the N-tank is implanted, using e.g. $5\times10^{12}$ per cm$^2$ of phosphorus at 80 keV. This yields the structure of FIG. 16.

Figure 17:
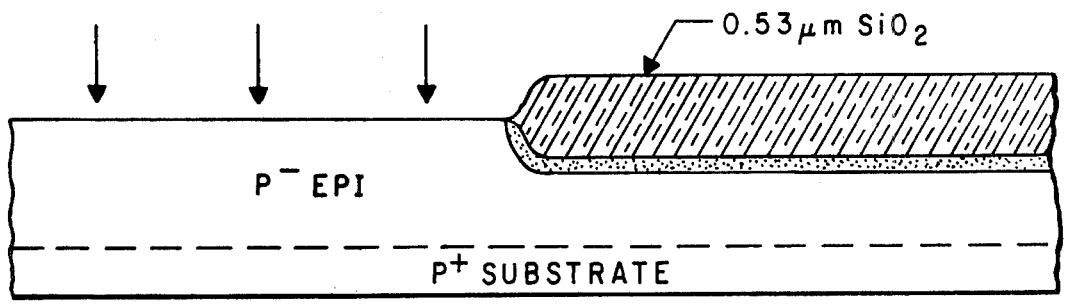
Figure 18:
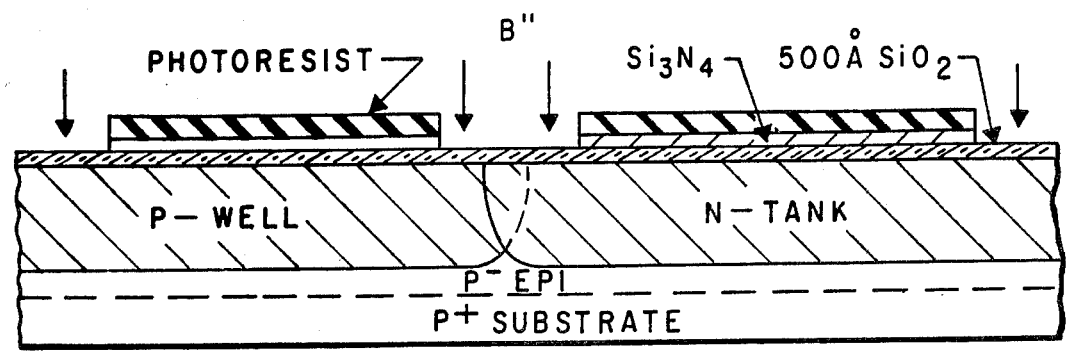
Figure 19:
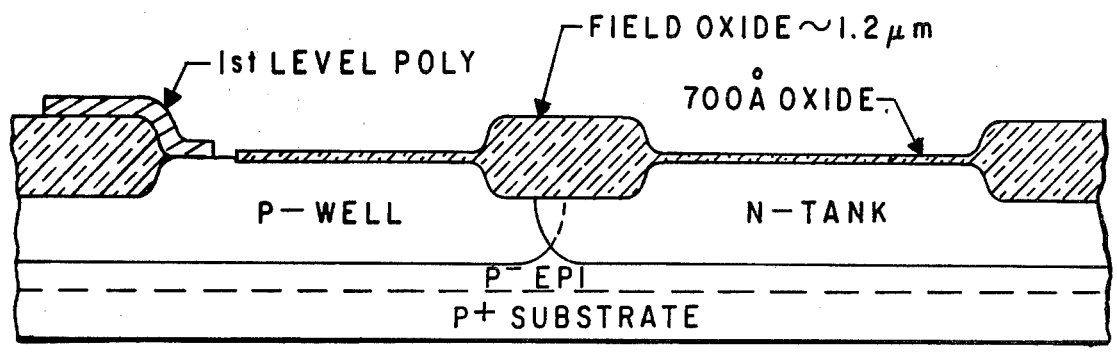
Figure 20:
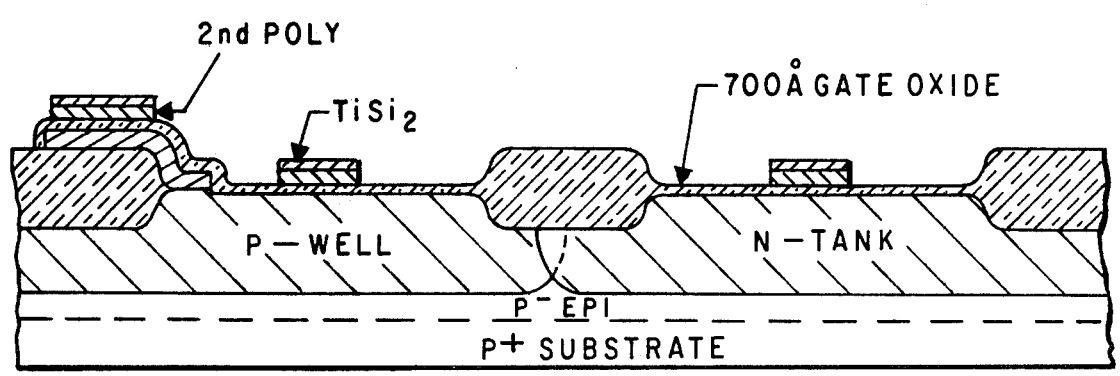

An oxide of e.g. 530 nm is grown in the N-tank region to act as a mask against the P-well implant which follows, and to act as a locater for subsequent alignments. The P-well region is then implanted with boron, at e.g. $4\times10^{11}$ per cm$^2$ at 60 keV, as shown in FIG. 17.

The tank oxide is stripped and the N-tank and P-well implants are driven in. A standard pad oxide is grown and nitride is deposited. The moat-complement image is cut in the nitride/oxide stack, and a blanket boron channel stop implant is performed, of e.g. $1.2\times10^{13}$ per cm$^2$ at 90 keV. This yields the structure shown in FIG. 18.

The photoresist is then stripped, and field oxidation is performed to yield an oxide thickness of about 1.2 microns. The nitride/oxide stack over the moat regions is then stripped. A desirable side effect of the field oxidation step is that the boron blanket channel stop implant can be used to raise the N-channel field threshold without overly reducing the P-channel field threshold, since the phosphorus concentration in the N-tank accumulates at the surface during the field oxidation step, whereas the boron in the P-well is leached out.

A 25 nm pre-gate oxide is then formed, to eliminate the "Kooi effect", and the pre-gate oxide is etached. A first gate oxide is then grown, to a thickness of 70 nm, and is etched. Optionally, a first contact pattern may also be etched at ths point. A 500 nm thick first poly level is then deposited, and is doped by using a phosphorus implant, e.g. $5\times10^{15}$ per cm$^2$ at 85 keV. This first level of poly is primarily intended as the bottom plate for precision poly-to-poly capacitors, as required in analog signal processing. It may also be used to form natural V$_T$ transistors, and can be used for very short interconnections, since its final sheet resistance inside the N-tank is around 150 ohms per square, and about 40 ohms per square outside the tank. (The difference is due to the counterdoping effect of the boron source/drain implant.)

The first poly level is then patterned and plasma etched, and the exposed gate oxide is wet etched. A second gate oxide, also 70 nm thick, is then grown in O$_2$+5% HCl. Atop the exposed first polysilicon areas, the first poly insulation oxide is simultaneously grown, to 110 nm thick. A boron blanket implant, of e.g. $5\times10^{11}$ per cm$^2$ at 40 keV, is used to adjust V$_{TN}$ and V$_{TP}$.

Optionally, for telecommunications circuit where depletion loads may be required for source follower circuits, an additional masking step can be included at this stage for a depletion (phosphorus) implant.

Figure 21:
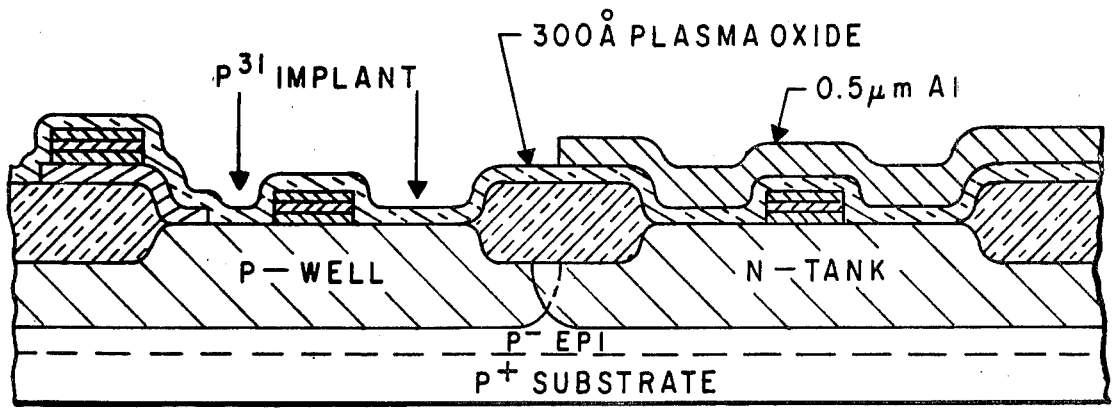

A 300 nm thick second poly layer is now deposited and doped. 200 nm of TiSi$_2$ is deposited by co-deposition of titanium and silicon. Preferably this is done by simultaneous E-beam co-evaporation of titanium and silicon. Alternately, co-sputtering or direct re-action can be used. The titanium silicide is then annealed, and the second poly level is patterned. (Wet etching must not be done after the silicide has been deposited.) The silicide, polysilicon, and exposed gate oxide are then plasma etched, producing a configuration as shown in FIG. 21.

Figure 22:
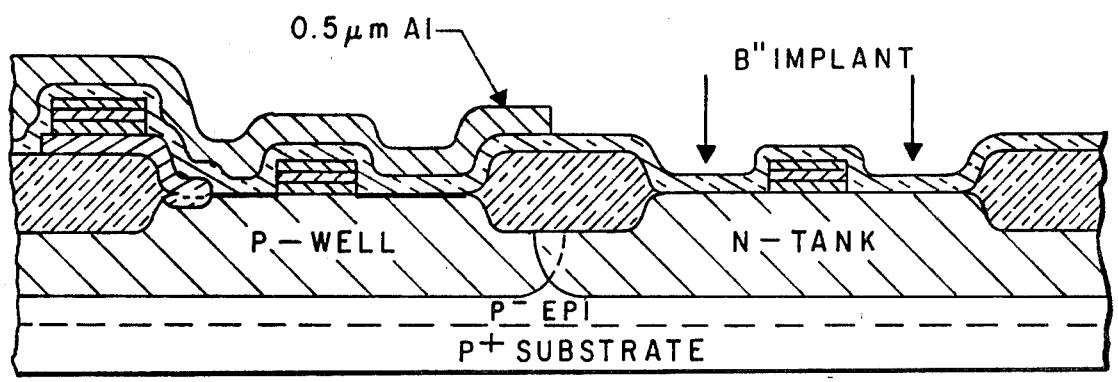

30 nm of plasma oxide is then deposited, followed by 500 nm of aluminum. The N+ source/drain layout is patterned, and the aluminum is etched. Aluminum masking is used to prevent removal difficulties caused by the high implant dose used. $8\times10^{15}$ per cm$^2$ of phosphorus is then implanted at 40 keV, as shown in FIG. 22.

Alternatively, both arsenic and phosphorus may be implanted. In this alternative, $5\times10^{15}$ per $cm^2$ of phosphorus would be implanted, e.g., together with $5\times10^{15}$ per $cm^2$ of arsenic. The higher diffusivity of phosphorus means that it will diffuse to form a junction in advance of any large As concentration, so that, after annealing, the source/drain regions would have a graded regions of gradually lowered conductivity adjacent to the ends of the channels. This would mean that the gradient of the electric field potential would be reduced at the ends of the channels, and therefore secondary carrier generation by impact ionization would be greatly reduced. Thus, short channel effects are reduced by this procedure, as is the danger of hot carrier effects.

The PMOS source/drains are then aluminum-masked and similarly implanted, with $5\times10^{15}$ per $cm^2$ of $BF_2$ at 67 keV, as shown in FIG. 1g. The aluminum masking is stripped, 50 nm of plasma oxide is deposited, and the source/drain implants are annealed and driven-in. 650 nm of phospho-silicate glass is then deposited and reflowed at 975C. The plasma oxide prevents the PSG from counter doping the PMOS source/drains during reflow.

The second contact level is then patterned, using two resist coats if negative resist is being used. About a 500 nm thickness is wet etched, and the remainder is plasma etched. Plasma etching is required because of the different etch rates of PSG and plasma oxide.

Figure 23:
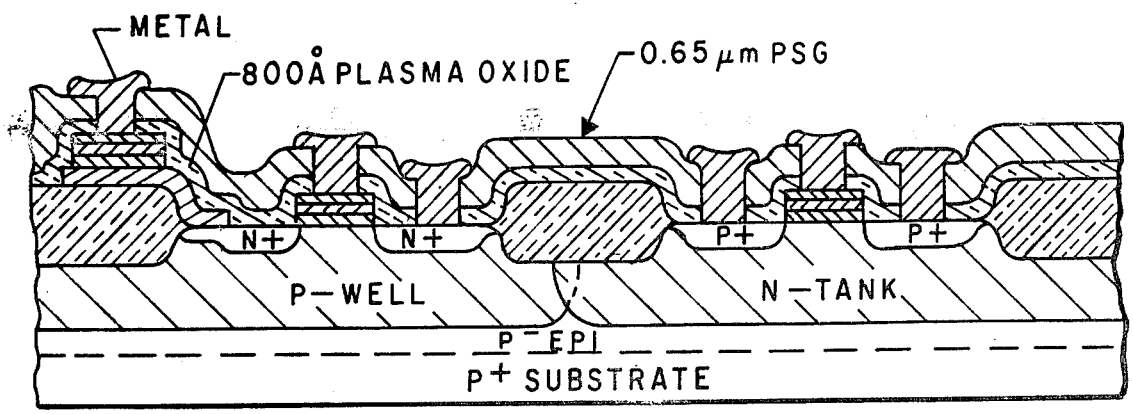
Figure 24:
FIGS. 24 through 30 show the sequence of processing steps used to make the gate structure of the nonvolatile transistor in the memory cell of the present invention.

Finally, 40 nm of plasma polysilicon is deposited, followed by 1200 nm of aluminum. The aluminum is then patterned, etched, and sintered, as shown in FIG. 23. 300 nm of plasma nitride is then deposited. The protective overcoat (POR) pattern is then applied, and the nitride is etched.

Figure 25:
Figure 26:
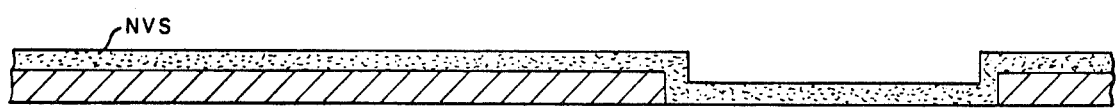
Figure 27:
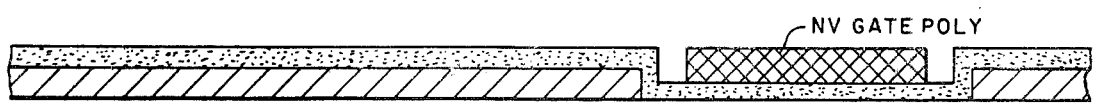

To incorporate formation of the nonvolatile stack in the high-voltage CMOS process as described above, further modifications are required. After the pre-gate oxidation and etch, in the process as described above, a 50 nm pad oxide is grown. A hole for the nonvolatile gate (i.e. for the dielectric underneath nonvolatile transistor M2), oversized by about 0.1 mil per edge, is patterned and the pad oxide is etched. At this point (FIG. 25), the threshold voltage of the nonvolatile transistor is optionally adjusted by an additional ion implant.

The nonvolatile stack is now deposited (15 nm of silicon nitride atop 5 nm of silicon dioxide). $TiO_2$ is now deposited, by depositing titanium metal overall and then oxidizing. Alternatively, CVD deposition of $TiO_2$ is used.

If necessary to avoid problems caused by migration of titanium into the silicon during high-temperature formation of the $TiO_2$, an additional layer of silicon nitride (e.g. 140 nm) is deposited over areas apart from the NV stack, before the nonvolatile stack (and $TiO_2$) is deposited. However, migration of titanium into the channel of the nonvolatile transistor (in the preferred memory cell design) is of little importance, since that transistor has such a large $K_P$.

After the $TiO_2$ has been formed, it is hydrogen annealled. Preferably, a one hour anneal in forming gas at 620° C. is used. Alternatively, if permitted by safety considerations, a higher concentration of hydrogenis used to permit a shorter annealling time. Since $TiO_2$ has a tremendous affinity for hydrogen, this hydrogen annealling step saturates the $TiO_2$ with molecular hydrogen, and the "hazy poly" problem is thus avoided. The hazy poly problem is believed to result from depletion of hydrogen from the process gas flow, during the reactions which participate in CVD deposition of polysilicon, by absorption into the $TiO_2$.

Figure 28:
Figure 29:
Figure 30:
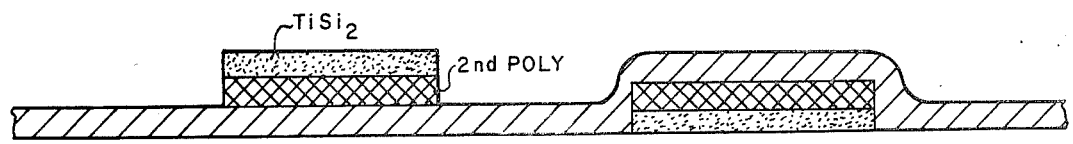

The first level polysilicon is then deposited (500 nm) and doped. The nonvolatile gate pattern is then applied, and the polysilicon, $TiO_2$, and NV stack are plasma etched together. A polysilicon plasma etch is first used, to cut through the first-level poly, and the $TiO_2$ plasma etch described below is then used. Finally, the pad oxide is wet etched, to produce the structure shown in FIG. 28.

The $TiO_2$ plasma etch, in the presently preferred embodiment, uses the following parameters: In a 16 inch reactor with one-half inch spacing, 1,000 watts is applied, to produce a power density of approximately one watt per square centimeter. At a temperature of approximately 75° C. and an absolute pressure of approximately 300 microns, a mixture of tetrafluoromethane and oxygen is applied, at a rate of 190 standard cubic centimeters per minute of $CF_4$ and 4 standard cubic centimeters per minute of $O_2$.

The etch rate of $TiO_2$ with these parameters is approximately 16 nm per minute. This mixture produces an etch rate of approximately 27 nm per minute on silicon dioxide or on silicon nitride, so that the selectivity of $TiO_2$ with respect to these other materials is less than unity. However, the selectivity of $TiO_2$ with respect to aluminum or photoresist is quite good.

Alternatively, this etch mixture may be used in an RIE mode to etch $TiO_2$. Thus, if a reactor is set up with 4.25 inch spacing and driven with 600 watts, with a gas flow of 200 standard cubic centimeters per minute of $CF_4$ and 100 standard cubic centimeters per minute of $O_2$ at 170 microns total pressure an etch rate of about 45 nm per minute will be attained. This is still an inconveniently high etch rate, so that overetching may easily occur. Moreover, plasma etching is more compatible with usual processing equipment arrangements for mass production.

It should be noted that other fluorine-bearing species besides $CF_4$ may be used. For example, $C_2F_6$ or other fluorinated hydrocarbons are alternatively used, as are fluorinated silane species.

Moderate anisotropy is attained with the above plasma etching conditions. If greater anisotropy is desired, this can of course be obtained by reducing the gas pressure.

Since $TiO_2$ has proven to be so resistant to efforts at wet etching, the above plasma-etching process is critical to the practicality of $TiO_2$ in semiconductor IC processing.

Alternatively, it is also possible to pattern $TiO_2$ without a $TiO_2$ etch, by patterning the titanium metal before oxidation. Titanium metal etches nicely in an acqueous solution of 1% Hf and 2% $H_2O_2$.

After the nonvolatile stack and the $TiO_2$ have been deposited and patterned, processing continues as in the high-voltage CMOS process described above, beginning with the step of growing the 70 nm second gate oxide and the 110 nm first poly insulation oxide. Note that the first-level poly layer, which the high voltage CMOS process makes available, has been used in this NV RAM process solely to form the gates of the nonvolatile transistors.

Note that the $TiO_2$ etch has eliminated any problem of lateral short circuiting between gates which may be caused by the conductive upper boundary of the $TiO_2$.

The remainder of the TiO$_2$ has the structure of polycrystalline rutile and has resistivity of up to $10^8$ ohm-cm (or better) depending on processing conditions. The actual dielectric constant of TiO$_2$ as formed in the process of the present invention is more than 100.

What is claimed is:

1. A memory cell, comprising:

a multi-dielectric MIS transistor comprising first and second source/drain regions of a first conductivity type;

a read-enable transistor, comprising first and second source/drain regions of a second conductivity type;

said nonvolatile and read-enable transistors each respectively comprising a gate, said respective gates being connected together;

said respective first source/drains of said nonvolatile transistor and of said read-enable transistor also being connected together, and said second source/drain of said read-enable transistor being connected to ground;

means for selectively connecting said second source/drain of said nonvolatile transistor to a bit line; and means for selectively connecting said gate of said nonvolatile transistor to a column line.

2. The cell of claim 1, wherein said nonvolatile transistor comprises a multi-dielectric structure underlying said gate.

3. The cell of claim 1, wherein each said respective means for selectively connecting comprises an isolation transistor, said respective isolation transistors each comprising a gate, and said respective gates of said respective isolation transistors being connected together.

4. The memory cell of claim 1, wherein said multi-dielectric structure of said nonvolatile transistor permits carrier injection at a voltage of 10 volts or less.

5. The cell of claim 1, wherein said nonvolatile transistor is a P-channel transistor,, and said read-enable transistor is an N-channel transistor.

6. The cell of claim 5, wherein said nonvolatile transistor has a positive threshold voltage if electrons are stored in said multi-dielectric structure thereof, and has a negative threshold voltage if holes are stored in said multi-dielectric structure thereof.

7. The memory cell of claim 5, wherein said nonvolatile transistor is positioned within an N-tank.

8. The cell of claim 3, wherein said respective isolation transistors each comprise a source and a drain of said second conductivity type.

* * * * *